US 12,046,253 B2

(12) United States Patent
Eeshwaroju et al.

(10) Patent No.: US 12,046,253 B2
(45) Date of Patent: Jul. 23, 2024

(54) SYSTEMS AND METHODS FOR A SIGNAL PROCESSING DEVICE

(71) Applicant: Harman International Industries, Incorporated, Stamford, CT (US)

(72) Inventors: Sreenivas Eeshwaroju, Novi, MI (US); Robert K. Cadena, Dearborn, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 595 days.

(21) Appl. No.: 17/445,064

(22) Filed: Aug. 13, 2021

(65) Prior Publication Data
US 2023/0047859 A1    Feb. 16, 2023

(51) Int. Cl.
*G10L 21/0232*    (2013.01)
*G06F 11/32*      (2006.01)
*G10L 21/0224*    (2013.01)

(52) U.S. Cl.
CPC ........ *G10L 21/0232* (2013.01); *G06F 11/322* (2013.01); *G10L 21/0224* (2013.01)

(58) Field of Classification Search
CPC . G10L 21/0232; G10L 21/0224; G06F 11/322
See application file for complete search history.

(56) References Cited

U.S. PATENT DOCUMENTS

| 3,711,769 A | 1/1973 | Peake |
| 6,263,289 B1 * | 7/2001 | Hassun ................. G01R 29/26 |
| | | 702/191 |
| 2008/0265868 A1 * | 10/2008 | Prather ................. G01R 23/20 |
| | | 324/76.19 |

(Continued)

FOREIGN PATENT DOCUMENTS

| CA | 2794946 A1 * | 3/2011 | ......... G10L 21/0232 |
| CN | 103200423 A * | 7/2013 | .......... G06F 11/1438 |

(Continued)

OTHER PUBLICATIONS

Krikorian, N., "Bridge Method for Measuring Amplitude Intermodulation Distortion," RF Design, vol. 18, No. 3, Mar. 1995, 2 pages.

(Continued)

*Primary Examiner* — Mohammad K Islam
(74) *Attorney, Agent, or Firm* — McCoy Russell LLP

(57) ABSTRACT

Methods and systems are provided for detecting artifacts in an electronic signal. In an embodiment, a method is provided comprising: connecting a first input of an electronic device to a first signal line of a signal processing device, such as an amplification device; connecting a second input of the electronic device to a second signal line of the signal processing device, the second signal line being downstream from the first signal line; establishing, based on an observed behavior of a first signal on the first signal line, an expected behavior of a second signal on the second signal line; and determining whether a difference exists between the expected behavior of the second signal and an observed behavior of the second signal. If a difference is detected, the expected behavior of a second signal and the observed behavior of the second signal may be recorded for later analysis.

20 Claims, 9 Drawing Sheets

(56) References Cited

U.S. PATENT DOCUMENTS

| | | | | |
|---|---|---|---|---|
| 2009/0323974 A1* | 12/2009 | Chang | .................... | H04R 29/00 |
| | | | | 381/59 |
| 2013/0142346 A1* | 6/2013 | Yang | .................... | H04R 29/001 |
| | | | | 381/58 |
| 2019/0088243 A1* | 3/2019 | Prasad | ............... | G10K 11/1754 |
| 2021/0160637 A1* | 5/2021 | Gouin | .................... | G08B 17/00 |

FOREIGN PATENT DOCUMENTS

| | | | | | |
|---|---|---|---|---|---|
| CN | 113949982 A | * | 1/2022 | .......... | G06F 11/1438 |
| EP | 2876894 A1 | * | 5/2015 | ............. | H04H 60/04 |
| JP | 4764995 B2 | * | 9/2011 | ......... | G10L 21/0208 |
| KR | 20150137557 A | * | 5/2014 | ......... | C01R 31/2825 |

OTHER PUBLICATIONS

Karandjeff, C. et al., "Precision audio nulling instrumentation achieves near—140dB measurements in a production environment," Proceedings of the 2010 IEEE International Test Conference, Nov. 2, 2010, Austin, Texas, 10 pages.

Dounas-Frazer, D. et al., "Investigating the role of model-based reasoning while troubleshooting an electric circuit," Physical Review Physics Education Research, vol. 12, Jun. 15, 2016, 20 pages.

Rios, L. et al., "Pathways to proposing causes for unexpected experimental results," ArXiv Cornell University Website, Available Online at https://arxiv.org/abs/1806.06042, Available as Early as Jun. 15, 2018, 4 pages.

"Low Noise, 1 GHz FastFET Op Amps Data Sheet," Analog Devices Website, Available Online at https://www.analog.com/media/en/technical-documentation/data-sheets/ADA4817-1_4817-2.pdf, Available as Early as Dec. 31, 2016, 31 pages.

"1.5 GHz, Ultrahigh Speed Op Amp Data Sheet AD8000," Radio Locma Website, Available Online at https://www.rlocman.ru/i/File/2017/04/21/AD8000.pdf, Available as Early as Dec. 31, 2016, 18 pages.

European Patent Office, Extended European Search Report Issued in Application No. 22188077.6, Jan. 4, 2023, Germany, 7 pages.

* cited by examiner

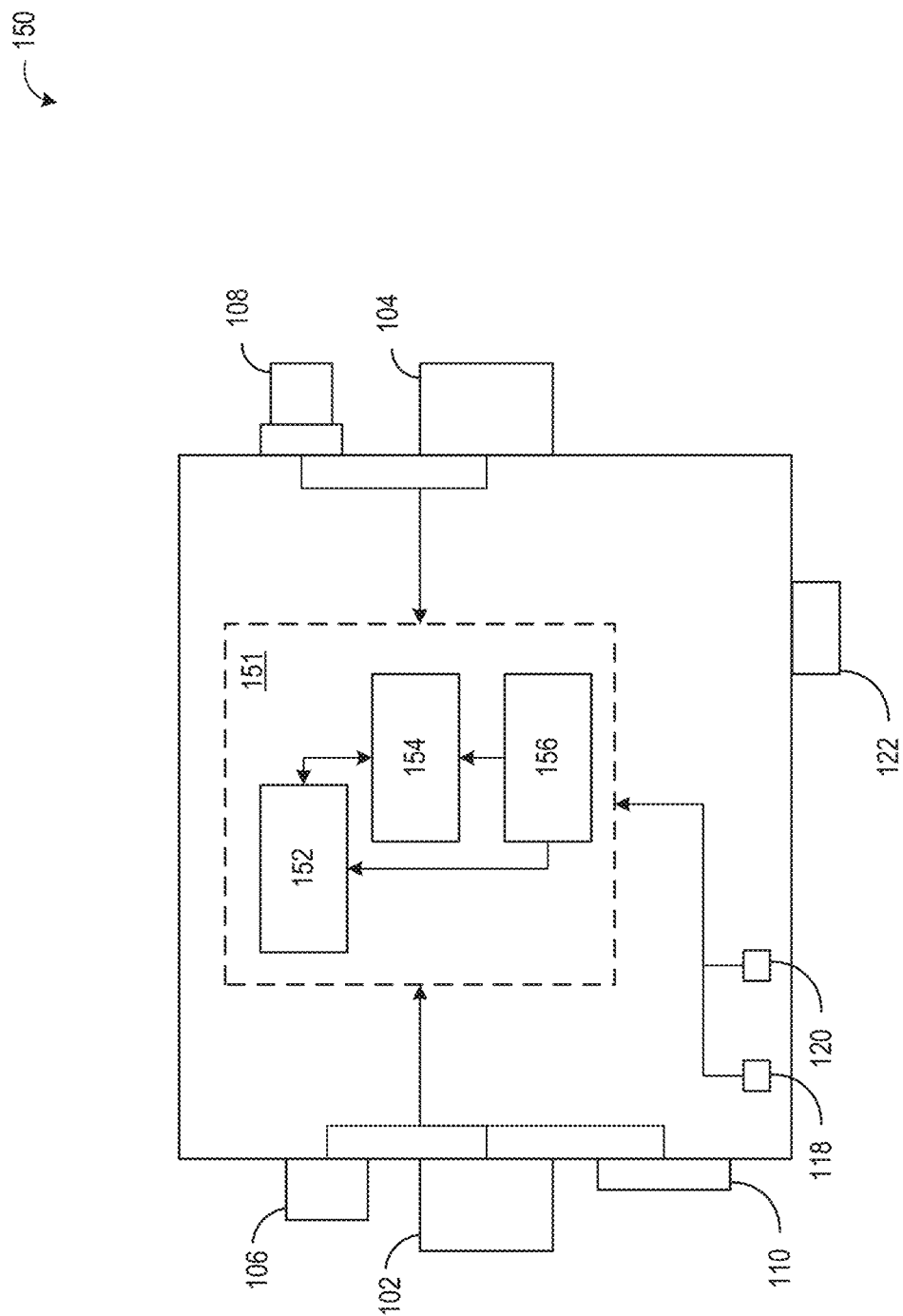

SYSTEMS AND METHODS FOR A SIGNAL PROCESSING DEVICE

FIELD

The disclosure relates generally to signal processing, and in particular, to detecting differences between two electronic signals.

BACKGROUND

During processing of an electronic signal, artifacts (e.g., intermittent errors) may be introduced that degrade playback. For example, during an amplification of an electronic signal carrying audio information, noise artifacts may be introduced that negatively impact an experience of a listener. The noise artifacts may include a sound such as a pop, a click, or a different unexpected behavior not derived from the signal. A root cause of an artifact introduced in the processing of an electronic signal may be difficult to determine, since the artifact may occur rarely, intermittently, and/or at random intervals. As a result, an engineer may spend an inordinate amount of time attempting to reproduce the artifact in order to resolve underlying issues.

For example, during a debugging stage, an engineer may monitor a signal over a long time interval before detecting an artifact, and the engineer may have to rigorously test various portions of an end-to-end path of a signal processing circuitry to determine the point along the path at which the artifact is being introduced. Additionally, determining whether an artifact issue has been resolved may entail durability testing over long durations. Debugging and testing may be further complicated in vehicular environments, where an artifact might occur when a vehicle is being driven, or being driven in a particular manner and/or in a particular environment.

SUMMARY

In various embodiments, the technical problems described above may be addressed by a method comprising: connecting a first input of an electronic device to a first signal line of a signal processing device; connecting a second input of the electronic device to a second signal line of the signal processing device, the second signal line being downstream from the first signal line; establishing, based on an observed behavior of a first signal on the first signal line, an expected behavior of a second signal on the second signal line; and determining whether a difference exists between the expected behavior of the second signal and an observed behavior of the second signal. If a difference is detected, the expected behavior of a second signal and the observed behavior of the second signal may advantageously be recorded for later analysis.

As an example, the electronic device may be a handheld, battery-powered debugging device (such as a pop finding device, pop finder, glitch finding device, or glitch finder) and the signal processing device may be (or may comprise) an amplification circuitry of a vehicular stereo system. When testing the stereo system at a manufacturer (e.g., during development, or prior to deployment), an engineer may occasionally notice pop sounds manifesting at one or more speakers of the vehicle. Determining a root cause of the pop sound may include comparing a first audio signal provided as input into the amplification circuitry with a second audio signal generated by the amplification circuitry at a time when the pop sound occurs, for example, on a device such as an oscilloscope.

To avoid having to monitor the first audio signal and the second audio signal on the oscilloscope while waiting for the pop sound to manifest, the engineer may connect the debugging device (e.g., a pop finding or glitch finding device) to the amplification circuitry such that an input signal to the amplification circuitry and an output signal from the amplification circuitry are received at the debugging device. The debugging device may predict and generate an expected output signal based on the input signal (e.g., by multiplying the input signal by an amplification gain), and may compare the behavior of the expected output signal with the behavior of the actually-observed output signal. If a difference is detected between the expected output signal and the observed output signal, the debugging device may store a recording of the input signal (and/or the expected output signal) and the observed output signal over a time interval including the difference. In this way, the engineer may advantageously use the debugging device to collect audio samples of noise artifacts over an extended period of time without having to actively monitor the setup and equipment, and perhaps without even having to be present at the vehicle. The engineer may later retrieve the audio samples and compare an observed output signal including the noise artifact and an expected output signal of each recorded audio sample on another device (e.g., an oscilloscope) to aid in determining a root cause of the noise artifacts.

Alternatively, the signal processing device may be a video processing device, and a signal reduction circuitry of the video processing device may be used to reduce an amplitude of a video signal. Upon detecting one or more artifacts (e.g., glitches) in a reduced amplitude video signal generated by the signal processing device, the engineer may use the debugging device as described above to collect recordings of video glitches in the reduced amplitude video signal to determine a root cause.

By not having to monitor a performance of signal processing circuitry in real time to reproduce the artifacts, an overall debugging time and/or testing time spent by the engineer may advantageously be reduced, and issues with the signal processing circuitry leading to artifacts, such as design issues and/or manufacturing issues, may be resolved in an accelerated manner. An additional advantage to the systems and methods disclosed herein is that the debugging device may be powered by a battery, allowing the debugging device to be used portably in a vehicle while the vehicle is being operated.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The disclosure may be better understood from reading the following description of non-limiting embodiments, with reference to the attached drawings, wherein below:

FIG. 1B shows an interior view of the electronic device of FIG. 1A for comparing a first signal with a second signal, in accordance with one or more embodiments of the present disclosure;

DETAILED DESCRIPTION

The following detailed description relates to methods and systems for efficiently detecting differences in signals produced during signal processing, such as noise artifacts in an audio signal (e.g., "pop noise") which may be introduced during audio amplification. Determining one or more root causes of the differences or artifacts in a device's output may be time consuming and difficult, in part due to a difficulty of reproducing the differences or artifacts. Because artifacts may occur infrequently and/or at random intervals, reproduction may entail spending long hours monitoring signals associated with a signal processing device. When an artifact is detected, a portion of a signal including the artifact may be recorded and analyzed to determine a root cause. As described herein, an efficiency of an artifact debugging process may be increased by using an electronic device to monitor, e.g., the device output and automatically record relevant portions of a signal including artifacts for subsequent analysis. In various embodiments, the electronic device may detect the artifacts by comparing the actual or observed device output with an expected device output generated at the electronic device in real time.

Figure 1A:
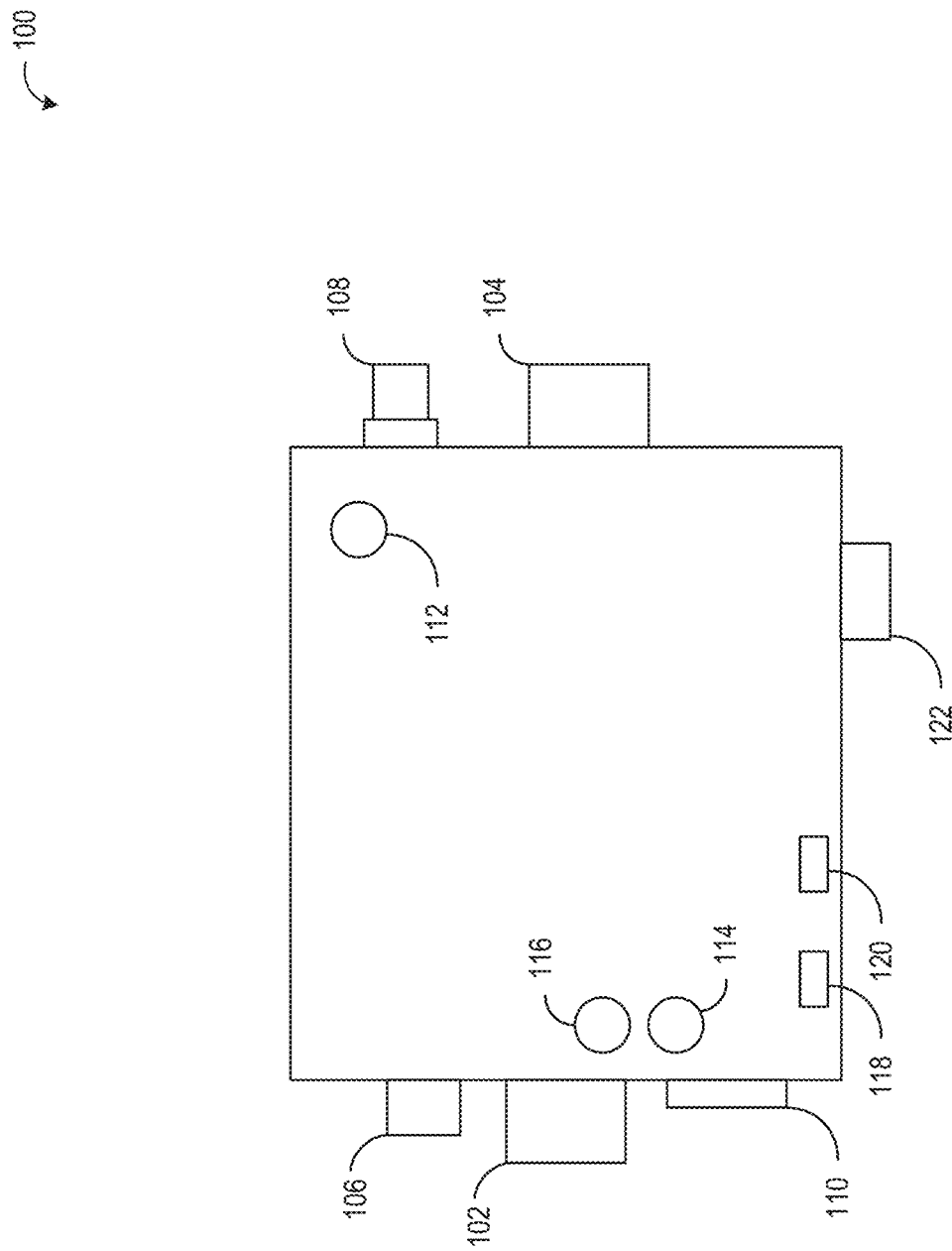
FIG. 1A shows an exterior view of an electronic device for comparing a first signal with a second signal, in accordance with one or more embodiments of the present disclosure.
Figure 1C:
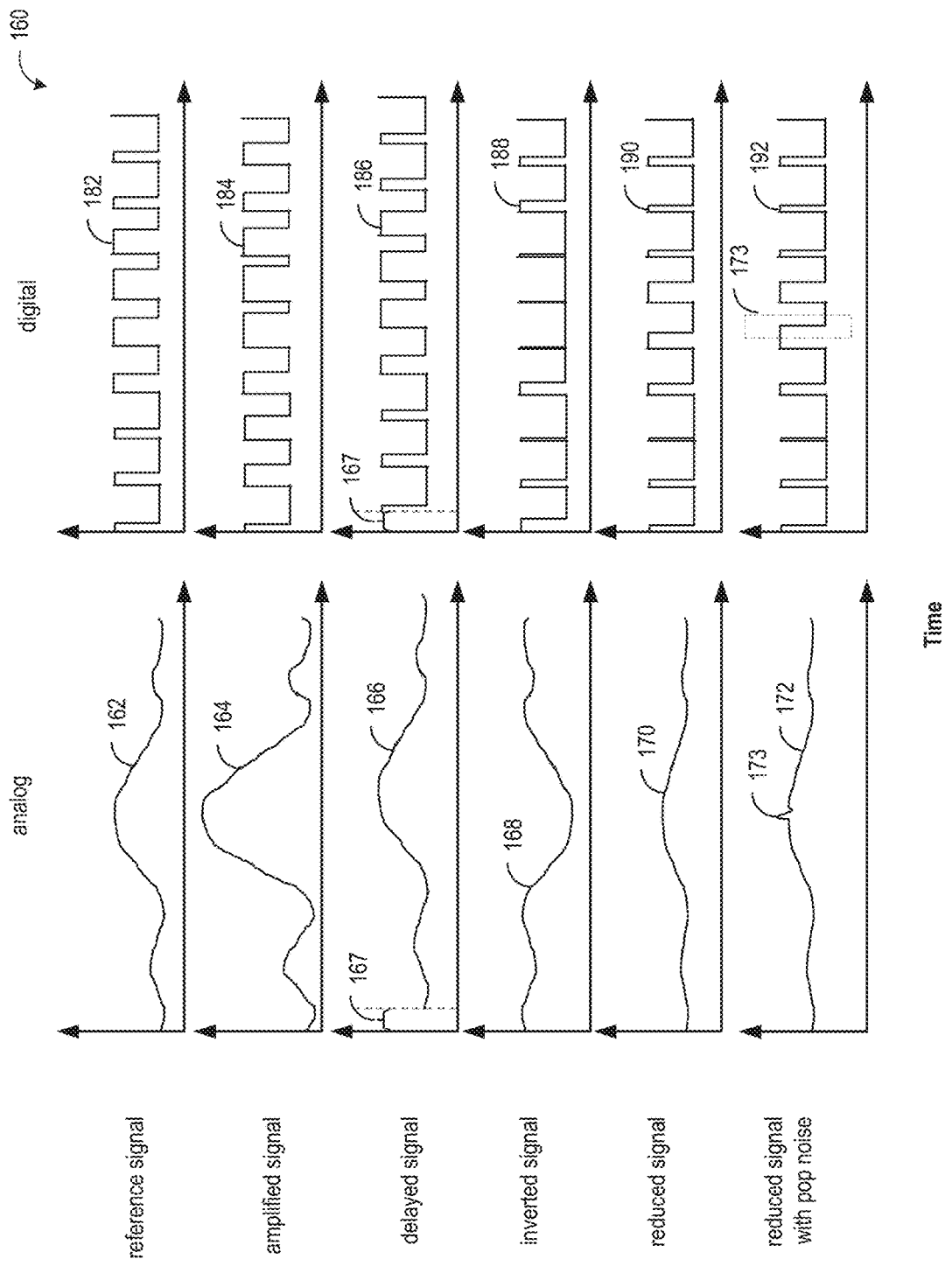
FIG. 1C shows plots of analog signals and digital signals that may be generated from a reference analog signal and a reference digital signal by a signal processing device, in accordance with one or more embodiments of the present disclosure.
Figure 2A:
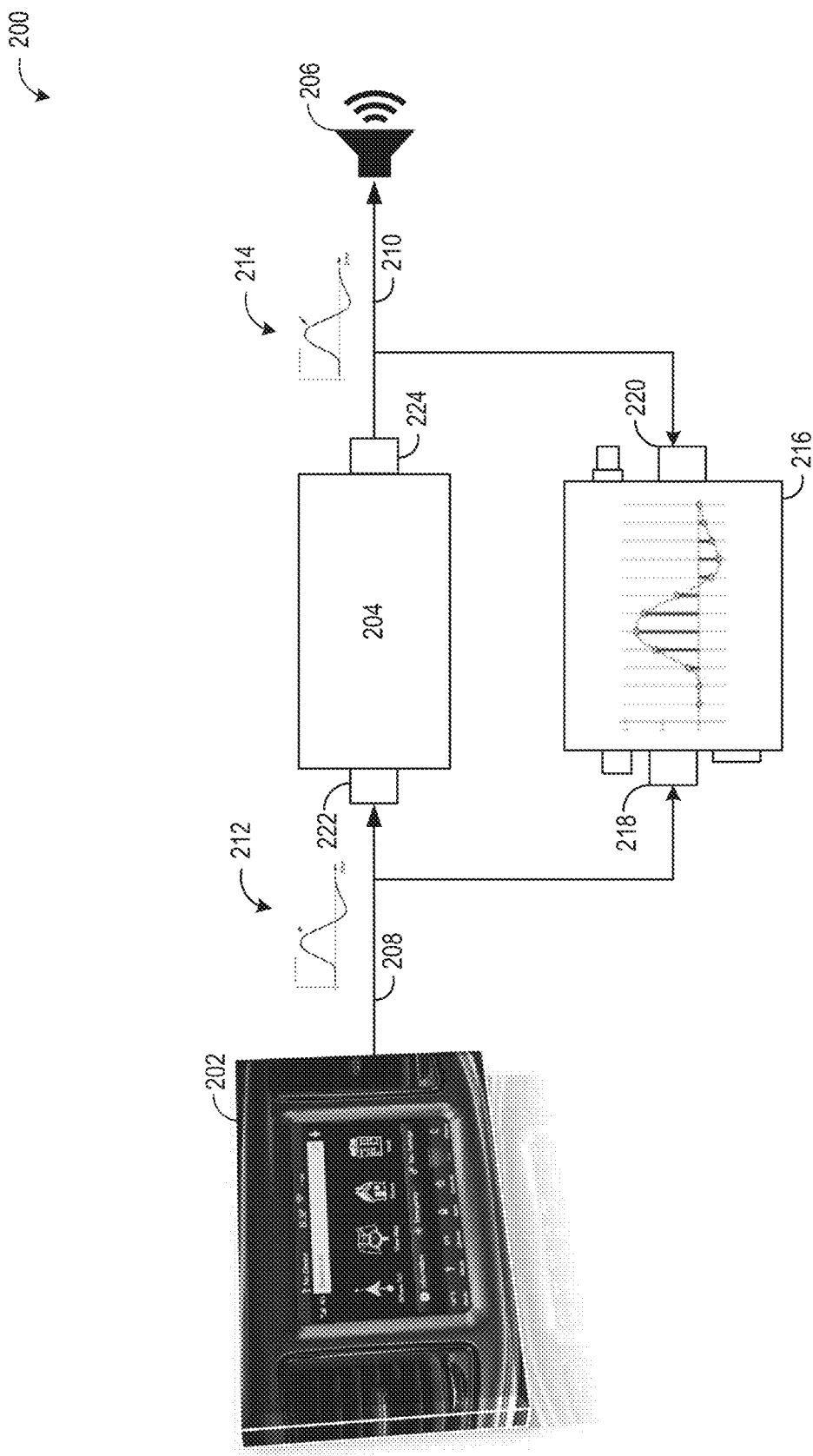
FIG. 2A is a schematic diagram showing a flow of data between components of a first signal processing system including the electronic device of FIGS. 1A and 1B, in accordance with one or more embodiments of the present disclosure.
Figure 2B:
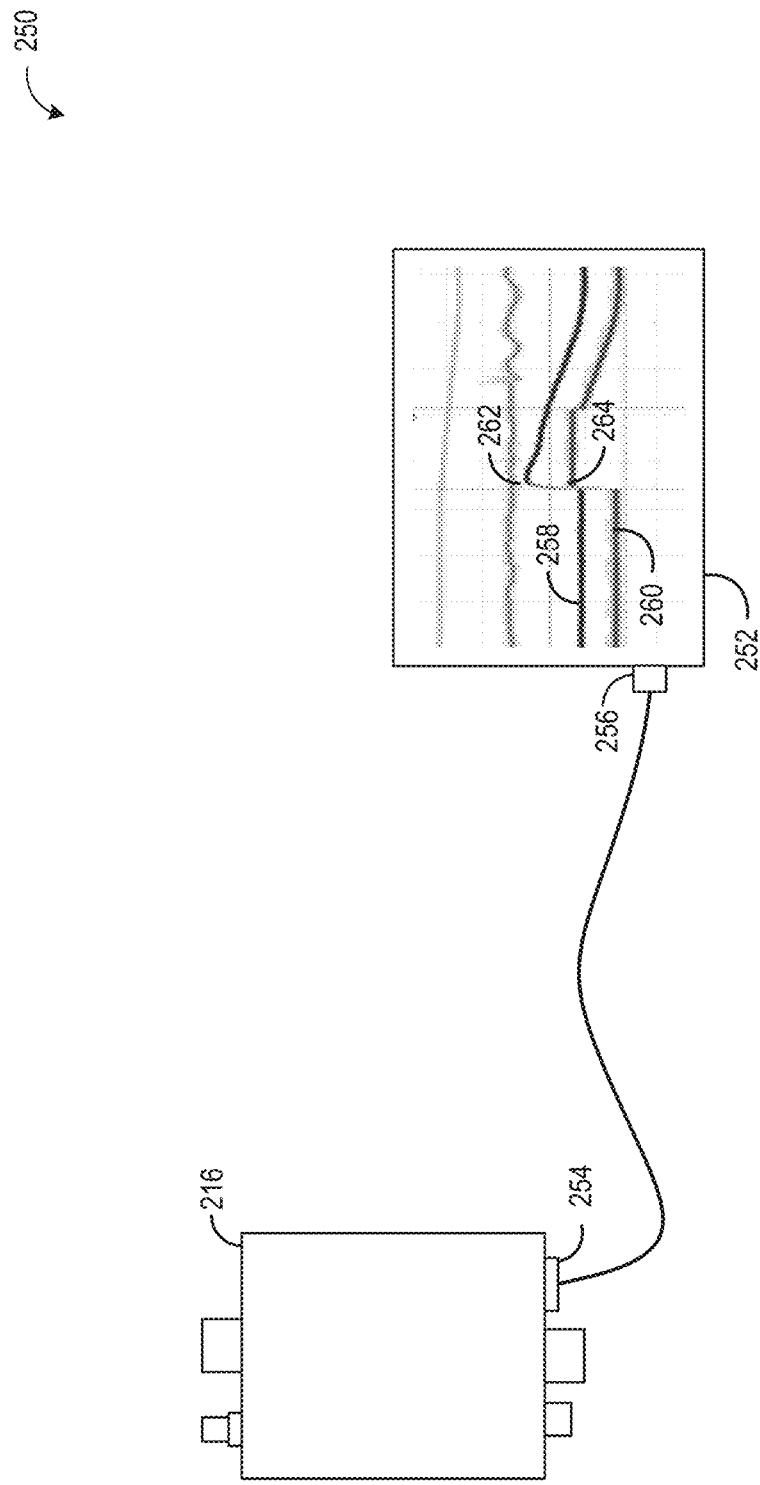
FIG. 2B is a schematic diagram showing a flow of data between components of a second signal processing system including the electronic device of FIGS. 1A and 1B, in accordance with one or more embodiments of the present disclosure.
Figure 3A:
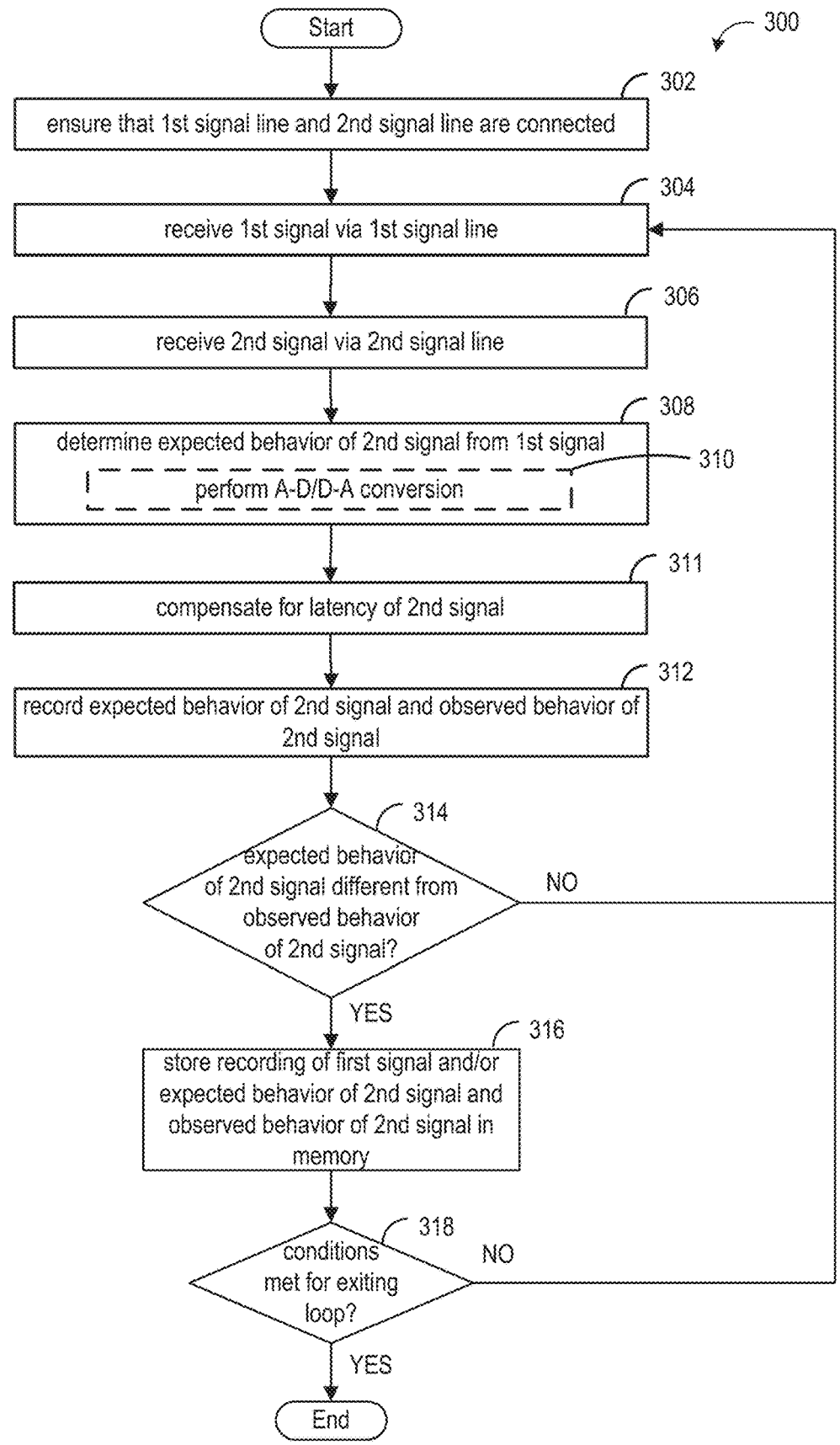
FIG. 3A is a flowchart illustrating an exemplary procedure for selectively recording differences detected in a signal, in accordance with one or more embodiments of the present disclosure.
Figure 3B:
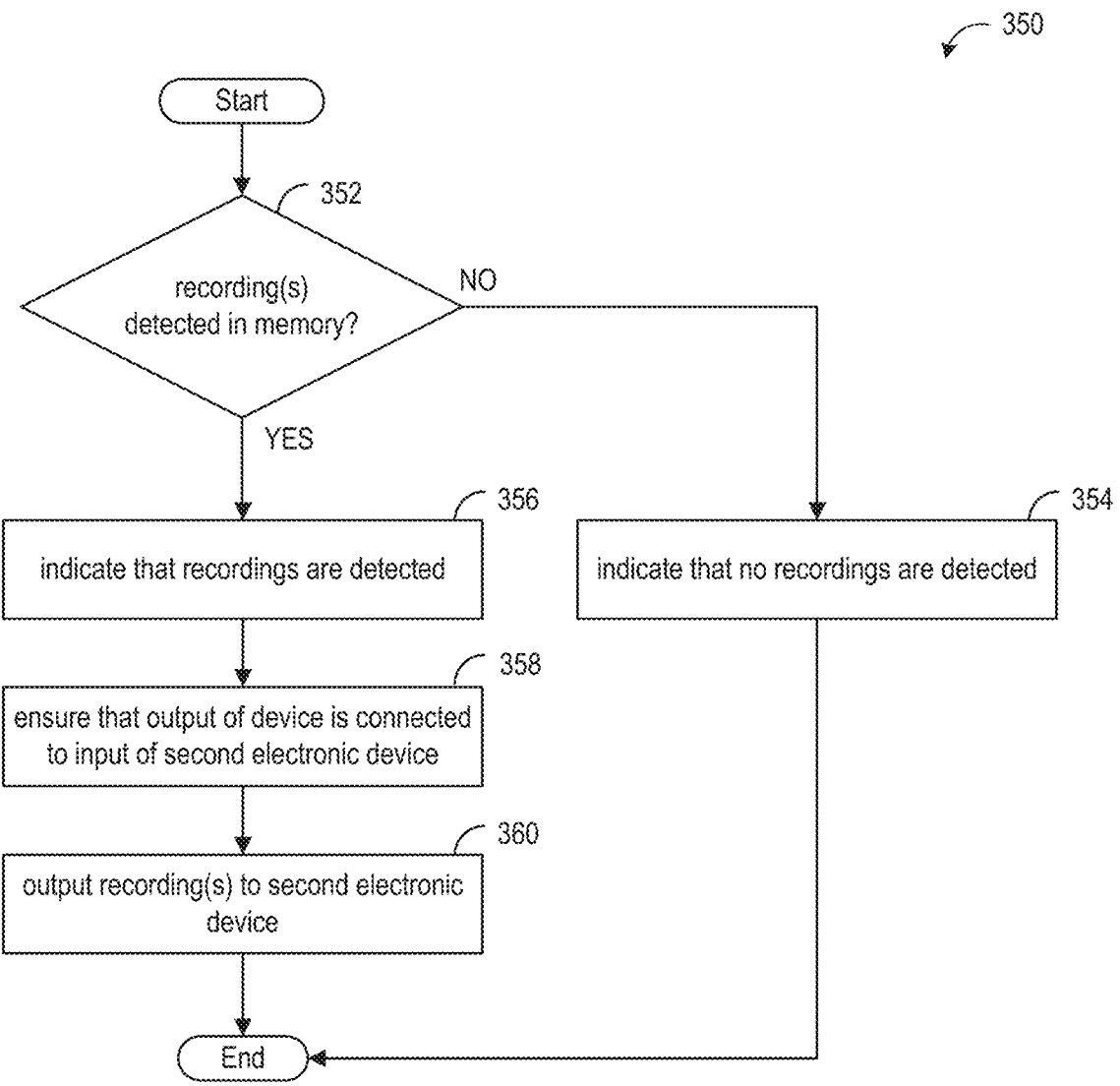
FIG. 3B is a flowchart illustrating an exemplary procedure for transferring recordings of differences detected in a signal from a first electronic device to a second electronic device, in accordance with one or more embodiments of the present disclosure.
Figure 4:
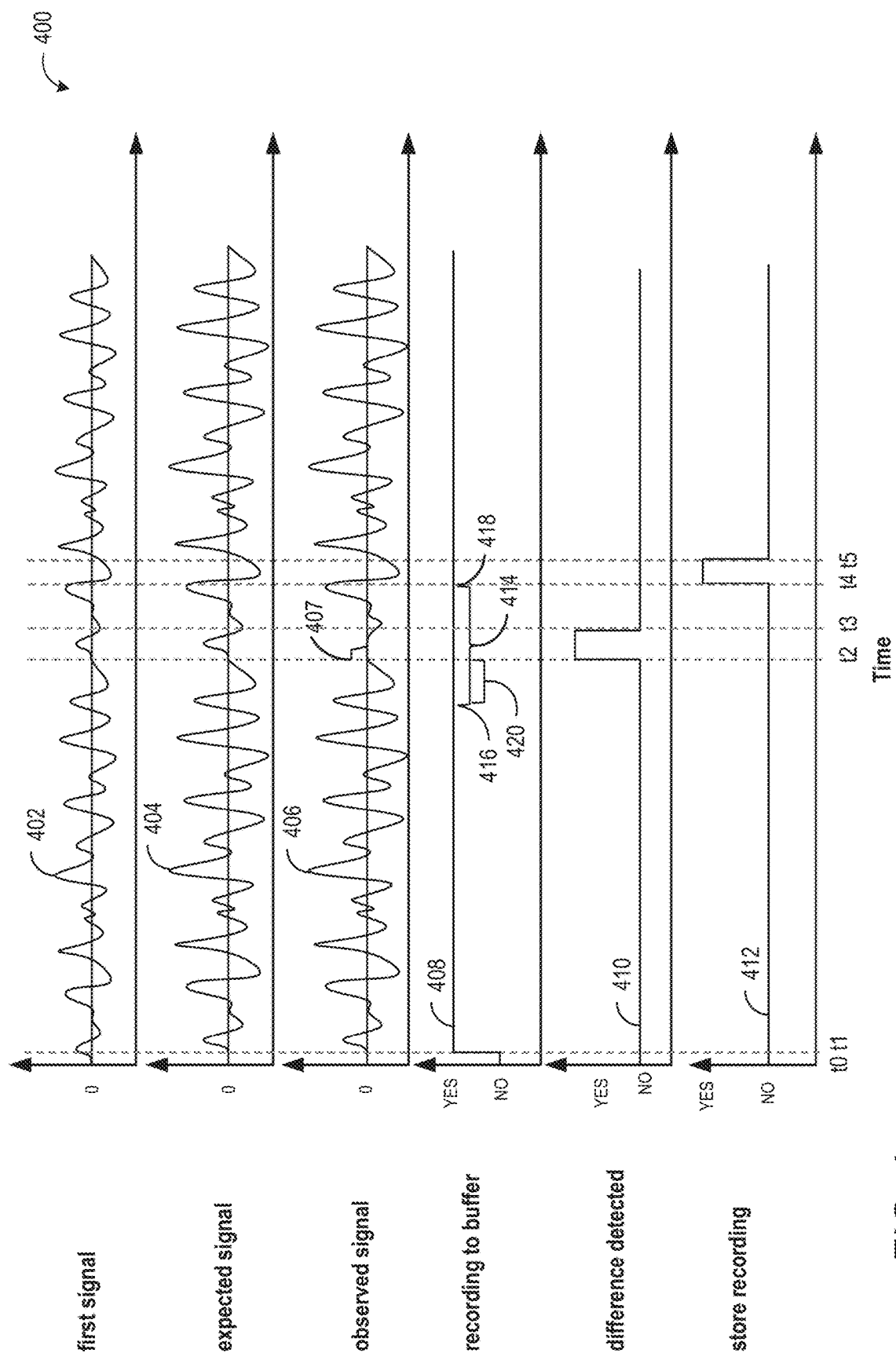
FIG. 4 is an operational sequence diagram illustrating a timing of a sequence of events carried out during processing of a signal, in accordance with one or more embodiments of the present disclosure.
Figure 5:
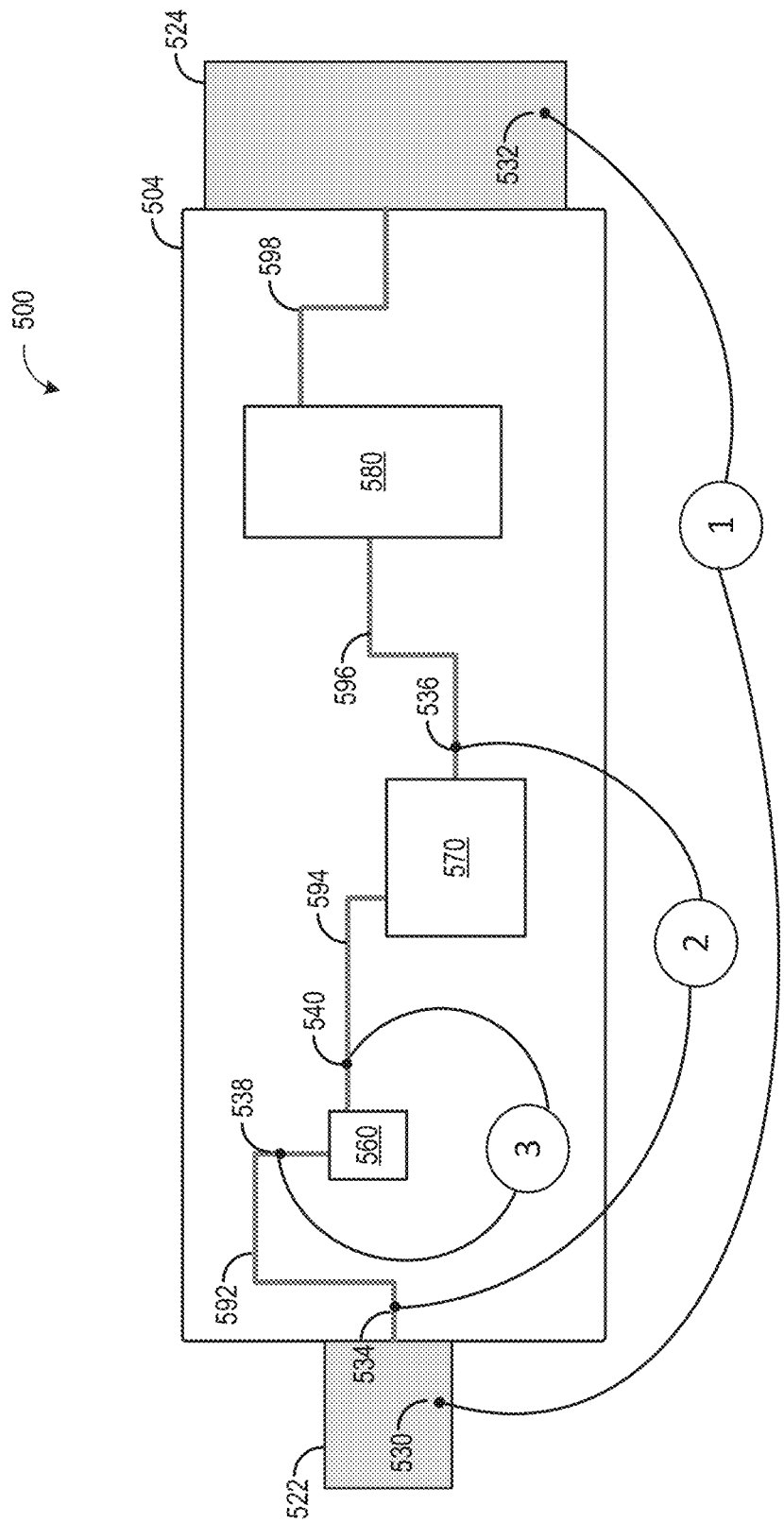
FIG. 5 shows alternative configurations for connecting to a first signal line and a second signal line of a signal processing device, in accordance with one or more embodiments of the present disclosure.

FIG. 1A depicts an electronic device, which may be used to compare a behavior of an expected signal derived from a first signal with a behavior of a second signal. FIG. 1B shows an internal view of the electronic device of FIG. 1A including various internal components. FIG. 1C shows different types of processing that may be carried out on an analog signal and/or digital signal. FIG. 2A depicts the electronic device of FIG. 1A configured within a signal processing system to receive the first signal from a first signal line into an amplification device, and receive the second signal from a second signal line out of the amplification device. The first signal line and the second signal line may be coupled to circuitry of the amplification device at different locations, for example, to isolate a defective component, as shown in FIG. 5. The electronic device may be further configured to store a first recording of the first signal and/or expected signal and a second recording of the second signal in response to detecting a difference between the behavior of the expected signal and the behavior of the second signal. FIG. 2B shows the first recording and the second recording being compared on a second electronic device (such as an oscilloscope). FIG. 3A depicts an algorithm of the electronic device that may be followed to determine whether a difference exists between the behavior of the expected signal and the behavior of the second signal. FIG. 4 shows an operational sequence diagram indicating an exemplary timing of the method of FIG. 3A. FIG. 3B depicts a second method that may be followed to display any detected differences between the behavior of the expected signal and the behavior of the second signal on the second electronic device.

FIG. 1A shows an exterior view of an electronic device 100 for comparing a first signal with a second signal. Electronic device 100 may include a first input connector 102 and a second input connector 104. First input connector 102 may be electronically coupled or connected to a first signal line, which may carry a first signal. Second input connector 104 may be electronically coupled or connected to a second signal line, which may carry a second signal.

Electronic device 100 may additionally include one or more additional first input connectors, such as additional first input connector 106, which may be coupled or connected to one or more additional first signal lines of a signal processing device (which may carry one or more additional first signals). Similarly, electronic device 100 may additionally include one or more additional second connectors (not depicted in FIG. 1A), which may be coupled or connected to one or more additional second signal lines of the signal processing device (which may in turn carry one or more additional second signals).

In some embodiments, electronic device 100 may be coupled to or connected to a single device producing a first signal (e.g., received at first input connector 102). In other embodiments, electronic device 100 may be coupled to or connected to a plurality of devices, each device of the plurality of devices producing a first signal (e.g., received at first input connector 102 and the one or more additional first input connectors). In still other embodiments, electronic device 100 may be coupled to or connected to one or more devices, which may each produce one or more first signals (e.g., received at first input connector 102 and the one or more additional first input connectors). In still further embodiments, electronic device 100 might not be coupled to any devices producing the first signal, and the electronic device 100 may be configured to produce the first signal.

Electronic device 100 may include a Universal Serial Bus (USB) connector 110. In some embodiments, the USB connector 110 may be used to couple electronic device 100 with a separate computing device (e.g., a PC, a tablet computing device, a smart phone, et cetera) used to configure one or more parameters of electronic device 100. For example, via the separate computing device, a user may select a signal type to be received by electronic device 100, set electronic device to transmit or receive a signal, select one or more types of processing to carry out on one or more signals, and the like.

Additionally and/or alternatively, electronic device 100 may be electronically coupled to a second electronic device via USB connector 110, whereby data (e.g., stored data) of electronic device 100 may be transmitted to the second electronic device via USB connector 110. The second electronic device may include a graphical user interface (GUI) on which one or more signals transmitted by electronic device 100 may be displayed. For example, an oscilloscope may be electronically coupled to USB connector 110 of the electronic device 100 via a cable of the oscilloscope. The stored data may include a recording of one or more signals, which may be transmitted to the oscilloscope for display to a user of electronic device 100.

Electronic device 100 may include one or more switches for controlling electric device 100. The one or more switches may include a power switch 118, which may be used to switch on electric device 100. In some embodiments, the one or more switches may also include one or more functionality switches 120, which may be used to execute a functionality of the electronic device 100. For example, the one or more functionality switches 120 may include a scan switch, which may be used to scan a content of a memory of electronic device 100, or to scan for one or more electronic signals received at one or more input connectors of electronic device 100. The one or more switches may also include a record switch, which may be used to initiate a recording of one or more signals received by the electronic device 100 or generated by the electronic device 100, or a different switch that executes a different functionality of the electronic device 100.

Electronic device 100 may include various indicator lights. For example, electronic device 100 may include a first indicator light 112, a second indicator light 114 and a third indicator light 116. Each of first indicator light 112, second indicator light 114 and third indicator light 116 may include one or more light-emitting diodes (LEDs) and/or one or more liquid crystal displays (LCDs).

In some embodiments, one of first indicator light 112, second indicator light 114, and third indicator light 116 may be used to indicate one or more operational states of the electronic device 100. For example, an indicator light may indicate whether the electronic device 100 is switched on, or whether a power level of a power storage device of the electronic device 100 is low, whether a memory of the electronic device 100 is full, whether a scan is being performed, or similar state-related information of the electronic device 100. One or more of first indicator light 112, second indicator light 114, and third indicator light 116 may be used to indicate that an electrical connection has been detected at one or more input connectors of the electronic device 100 (e.g., the first input connector 102, the second input connector 104 and the additional first input connector 106, and/or the USB connector 110). Additionally, one or more of first indicator light 112, second indicator light 114, and third indicator light 116 may be used to indicate to a user of electronic device 100 that one or more differences have been detected between an observed behavior of the second signal and an expected behavior of the second signal.

As an example, a user of electronic device 100 may detect that electronic device is not turned on by observing that second indicator light 114 is not illuminated. The user may then select power switch 118 to turn on the electronic device, and the second indicator light 114 may become illuminated. The user may subsequently select a first scan switch (e.g., of the one or more functionality switches 120) to scan the memory of electronic device 100 for recorded signals. If one or more signals are not detected on electronic device 100, the user may connect electronic device 100 to an amplifier (as described in greater detail below) to receive one or more signals comprising inputs and/or outputs of the amplifier. The user may subsequently turn on the amplifier, and select a second scan switch to scan for one or more signals received at electronic device 100. If the one or more signals are detected, third indicator light 116 may be illuminated. In response to observing that third indicator light 116 is illuminated, the user may select a recording switch (e.g., of the one or more functionality switches 120) to initiate a recording of the one or more signals.

Alternatively, if one or more signals are detected as a result of the user selecting the first scan switch, the user may decouple or disconnect electronic device 100 from devices, then couple or connect electronic device 100 to a different electronic device (e.g., an oscilloscope) to analyze the one or more signals. In various embodiments, the user may connect electronic device 100 to the different electronic device via USB connector 110.

Electronic device 100 may be configured to detect differences between the observed behavior of the second signal and the expected behavior of the second signal. The expected behavior of the second signal may be generated based on an observed behavior of the first signal. For example, first input connector 102 and second input connector 104 may be coupled to a signal processing circuitry of a signal processing device, with the first signal line being before the signal processing circuitry, and the second signal line being after the signal processing circuitry (e.g., on an input-side and an output-side of the signal processing circuitry, respectively). Accordingly, in various embodiments, the second signal may at least in part represent a result of a processing of the first signal performed by the signal processing circuitry.

As a result, the expected behavior of the second signal may at least in part be established by electronic device 100 by reproducing the processing performed by the signal processing circuitry at electronic device 100. For example, the signal processing circuitry may include amplification circuitry, and the expected behavior of the second signal may be established by multiplying the observed behavior of the first signal by an amplifier gain. If the expected behavior of the second signal is different from the observed behavior of the second signal, it may be determined that a flaw exists in the amplification circuitry.

Electronic device 100 may also include a trigger connector 108, which may be used to connect electronic device 100 to a separate computing and/or display device. For example, the separate computing and/or display device may include an oscilloscope, a computer coupled to a display screen (such as a monitor), a computing device with an integrated monitor or screen (e.g., a laptop computer), a handheld computing device (e.g., a tablet, a smart phone, a dedicated debugging device, et cetera), or a different type of computing device. Via the trigger connector 108, electronic device 100 may provide an indication that one or more differences (e.g., due to artifacts) have been detected between the expected behavior and the observed behavior. For example, an engineer may connect electronic device 100 to a laptop to receive a notification that a difference has been detected, so that the engineer may connect electronic device 100 to an oscilloscope or similar device to view the difference.

Electronic device 100 may additionally include a charging interface 122, where electronic device 100 may be coupled to a source of power via a charging cable to charge a battery of electronic device 100.

FIG. 1B shows an interior view of electronic device 100, which may include a processing circuitry 151. In some embodiments, processing circuitry 151 may comprise custom-designed logic devices or circuitry to perform various operations. For some embodiments, processing circuitry 151 may comprise at least one or more processors 152, a memory 154, and a power source 156, which may be arranged to perform various operations of processing circuitry 151. In some embodiments, one or more devices or circuits of processing circuitry 151 may be implemented by combinations of logic devices, circuitry, other hardware elements, and/or software-configured elements. Processors 152 may include a central processor (CPU), according to some embodiments. According to other embodiments, processors 152 may include other electronic components capable of carrying out processing functions, such as a digital signal processor, a field-programmable gate array (FPGA), or a graphic board. According to other embodiments, processors 152 may include multiple electronic components capable of carrying out processing functions. For example, processors 152 may include two or more electronic components selected from a list of electronic components including: a central processor, a digital signal processor, a field-programmable gate array, and a graphic board.

Processing circuitry 151 may receive signals and/or information from one or more external sources. In some embodiments, the external sources may be physically coupled to electronic device 100 via the input connectors of electronic device 100 described above. In other embodiments, the processing circuitry 151 may receive signals and/or information from the external sources via wireless communication, or via a combination of external sources that are physically coupled or wirelessly connected to electronic device 100.

As discussed herein, memory in general, and memory 154 in particular includes any non-transitory computer readable medium in which programming instructions are stored. For the purposes of this disclosure, the term tangible computer readable medium is expressly defined to include any type of computer readable storage. The example methods and systems may be implemented using coded instruction (e.g., computer readable instructions) stored on a non-transient computer readable medium such as a flash memory, a read-only memory (ROM), a random-access memory (RAM), a cache, or any other storage media in which information is stored for any duration (e.g. for extended period time periods, permanently, brief instances, for temporarily buffering, and/or for caching of the information). Computer memory of computer readable storage mediums as referenced herein may include volatile and non-volatile or removable and non-removable media for a storage of electronic-formatted information such as computer readable program instructions or modules of computer readable program instructions, data, et cetera, that may be stand-alone or as part of a computing device. Examples of computer memory may include any other medium which can be used to store the desired electronic format of information and which can be accessed by the processor or processors or at least a portion of a computing device. Memory 154 may include executable instructions that, when executed by the one or more processors 152, carry out operations of various methods disclosed herein. Memory 154 may include a memory card that may be inserted into electronic device 100.

Power source 156 may provide power to electronic device 100, whereby electronic device 100 may be operated in a portable manner that does not entail accessing power from a separate power source via a power cable during operation. In some embodiments, power source 156 may include one or more batteries. In some embodiments, power source 156 may be a rechargeable power source (e.g., one or more rechargeable batteries), and the rechargeable power source may be charged via a power cable which may be electronically coupled to charging interface 122.

Referring now to FIG. 1C, a plot diagram 160 shows exemplary plots of different types of signals that may be generated based on a reference signal during processing of the reference signal by a signal processing device. In various embodiments, the signal processing device may receive the reference signal at an input of the signal processing device, perform one or more operations on the reference signal to generate an adjusted signal, and output the adjusted signal at an output of the signal processing device. The one or more operations performed on the reference signal may depend on the nature or type of the signal processing device.

As described herein, artifacts generated in the adjusted signal as a result of the one or more operations may be detected by an electronic debugging device such as electronic device 100, when the reference signal is coupled to a first input connector (e.g., first input connector 102) of the electronic debugging device and the adjusted signal is coupled to a second input connector (e.g., second input connector 104) of the electronic debugging device.

In some embodiments, the reference signal may be an analog signal, while in other embodiments, the reference signal may be a digital signal. Additionally, the reference signal may have been converted from a different domain. For example, the reference signal may be a digital signal that was converted to the digital domain from an original analog signal received at an input of the signal processing device, or the reference signal may be an analog signal that was converted to the analog domain from an original digital signal received as an input at the signal processing device.

Plot diagram 160 includes a plot 162 of an example analog reference signal. The analog reference signal may be any type of electronic signal. For example, the analog reference signal may be an audio signal (e.g., a signal carrying or bearing audio information), or a video signal (e.g., a signal carrying or bearing video information), or a different type of electronic signal. The analog reference signal may be generated by a signal source external to the signal processing device (e.g., of a home stereo or video system, et cetera).

In some embodiments, the one or more operations performed on the analog reference signal by the signal processing device may include an amplification operation, where an amplitude of the analog reference signal may be proportionally increased. For example, the analog reference signal may be multiplied by an amplifier gain at an amplification circuitry of the signal processing device. A result of multiplying the analog reference signal by the amplifier gain is depicted in a plot 164, which shows an analog amplified signal.

In some embodiments, the one or more operations performed on the analog reference signal by the signal processing device may include a delaying operation, where a delay in the analog reference signal may be introduced. A result of delaying the analog reference signal is shown in a plot 166, where the analog reference signal has been delayed by a time increment 167 to generate an analog delayed signal.

In some embodiments, the one or more operations performed on the analog reference signal by the signal processing device may include an inversion operation, where an amplitude of the analog reference signal may be inverted (e.g., with respect to a y-axis of plot 162) by an inversion circuitry of the signal processing device. An analog inverted signal is shown in plot 168.

In some embodiments, the one or more operations performed on the analog reference signal by the signal processing device may include a reduction operation, where an amplitude of the analog reference signal may be proportionally reduced. Specifically, the analog reference signal may be multiplied by a signal reduction parameter (e.g., a gain less than one) at a signal reduction circuitry of the signal processing device. A result of multiplying the analog reference signal by the signal reduction parameter is depicted in a plot 170, which shows an analog reduced signal.

Any of the signals outputted by the signal processing device may include an artifact, which may be caused by a flaw in a component of the signal processing circuitry of the signal processing device. For example, a flaw in the signal reduction circuitry may introduce an artifact in the analog reduced signal, as shown in a plot 172, where an artifact 173 is been introduced in the analog reduced signal of plot 170.

To detect an artifact such as artifact 173, the electronic debugging device described above may be coupled to the signal processing circuitry in a manner that will encompass selected portions of the signal processing circuitry. The first electronic debugging device may receive the analog reference signal, and reproduce the one or more operations that the selected portions of the signal processing circuitry are expected to perform on the analog reference signal to generate an expected analog output. An observed analog output of the selected portions of the signal processing circuitry may be compared with the expected analog output.

For example, to detect artifact 173, the electronic debugging device may receive the analog reference signal, and multiply the analog reference signal by the signal reduction parameter, to generate the expected analog output signal. The expected analog output signal may be substantially similar to the analog reduced signal of plot 170. The analog reduced signal may be compared with the observed output of the signal processing device, which may be substantially similar to the analog reduced signal with pop noise shown by plot 172. By comparing the analog reduced signal of plot 170 with the analog reduced signal with pop noise of plot 172, artifact 173 may be detected.

As another example, if the signal processing device is configured to generate the analog amplified signal from the analog reference signal, the electronic debugging device may generate the expected analog output signal by multiplying the analog reference signal by the amplifier gain of the signal processing device (e.g., resulting in the analog amplified signal shown in plot 164). The expected analog output signal may then be compared with an observed output of the signal processing device to determine whether an artifact is present. In the process, the electronic debugging device may reproduce any of the one or more operations performed by the signal processing device (e.g., amplification, reduction, delay, inversion, et cetera) to generate the expected analog output signal for comparing to the observed output of the signal processing device.

As described above, in some embodiments, the reference signal may be a digital reference signal, such as the digital reference signal shown in a plot 182. The digital reference signal shown in plot 182 may be a digital version of the analog reference signal shown by plot 162. For example, the digital reference signal may be a result of converting the analog reference signal to a digital domain.

The one or more operations performed by the signal processing device on the analog reference signal may also be performed on the digital reference signal. For example, a plot 184 shows a digital amplified signal generated from the digital reference signal; a plot 186 shows a digital delayed signal generated from the digital reference signal; a plot 188 shows a digital inverted signal generated from the digital reference signal; and a plot 190 shows a digital reduced signal generated from the digital reference signal. Plot 192 shows the digital reduced signal of plot 190, which may correspond with the analog reduced signal of plot 170, including artifact 173 represented in the digital domain.

Referring now to FIG. 2A, a schematic diagram of a first signal processing system 200 is shown, including an audio source 202, an audio amplification device 204, and a speaker 206. While FIG. 2A shows an audio system, it should be appreciated that in other embodiments, signal processing system 200 may be a different type of system based on processing a different type of electronic signal. For example, the electronic signal may be a video signal, a temperature signal, a humidity signal, or another type of electrical or electronic signal.

Audio source 202, audio amplification device 204, and speaker 206 may be serially electronically coupled, so that audio source 202 may be electronically coupled to an input connector 222 of audio amplification device 204 via a first connection 208, and an output connector 224 of audio amplification device 204 may likewise be electronically coupled to speaker 206 via a second connection 210. Thus, an audio signal generated by audio source 202 may be transmitted to audio amplification device 204 via first connection 208, and may be amplified by audio amplification device 204 to generate an amplified output audio signal. The output audio signal may in turn be transmitted from audio amplification device 204 to speaker 206 via second connection 210, and speaker 206 may then play the amplified output audio signal.

First signal processing system 200 may also include an electronic device 216, which may be a non-limiting embodiment of electronic device 100. A first input connector 218 of electronic device 216 may be electronically coupled to first connection 208 (and/or to input connector 222 of audio amplification device 204), and a second input connector 220 of electronic device 216 may be electronically coupled to second connection 210 (and/or to output connector 222 of audio amplification device 204).

When configured in such a manner, first connection 208 may be a first signal line to which first input connector 218 of electronic device 216 is coupled, and a first audio signal 212—e.g., an audio signal generated by audio source 202—may be the audio signal carried by first connection 208. Similarly, second connection 210 may be a second signal line to which second input connector 220 of electronic device 216 is coupled, and a second audio signal 214—e.g., an audio signal generated by audio amplification device 204—may be the audio signal carried by second connection 210.

However, in other configurations, either (or both) of the signal lines to which first input connector 218 and second input connector 220 are coupled may be inside of a housing or external case of audio amplification device 204. As an example, a signal line within audio amplification device 204, on an input side of and/or upstream of the amplification circuitry, may be a first signal line to which first input connector 218 is coupled. First audio signal 212 may then be an audio signal carried by the internal signal line on the input side of and/or upstream of the amplification circuitry. As another example, a signal line within audio amplification device 204, on an output side of and/or downstream of the amplification circuitry, may be a second signal line to which second input connector 220 is coupled. Second audio signal 214 may then be an audio signal carried by the internal signal line on the output side of and/or downstream of the amplification circuitry.

Accordingly, in various configurations, first input connector 218 of electronic device 216 may be connected to a signal line either external to or internal to audio amplification device 204, and first audio signal 212 may thus be an audio signal carried by a signal line either external to or internal to audio amplification device. Similarly, second input connector 220 of electronic device 216 may be connected to a signal line either external to or internal to audio amplification device 204, and second audio signal 214 may thus be an audio signal carried by a signal line either external to or internal to audio amplification device. Signal lines internal to audio amplification device may be associated with a circuit board within audio amplification device 204, such as at a trace or a pin of a component on the circuit board.

Referring briefly to FIG. 5, an example signal line connection diagram 500 is shown, including a signal processing device 504, which in some embodiments may be an amplification device. Signal processing device 504 may receive a first signal at an input connector 522, and may output a second signal at an output connector 524.

Processing of the first signal may be carried out by one or more integrated circuits arranged within signal processing device 504, such as an integrated circuit 560, an integrated circuit 570, and an integrated circuit 580, which may comprise packaged components. Signal processing device 504 may also include one or more interconnects, such as a first interconnect 592, a second interconnect 594, a third interconnect 596, and a fourth interconnect 598, which may include wiring (e.g., traces, wires, cables, and/or other physical paths for carrying signals), various analog circuitries or devices, and/or various digital circuitries or devices. Taken together, the integrated circuits and interconnects of signal processing device 504 may constitute an end-to-end path of the signal processing circuitry, starting at input connector 522 and ending at output connector 524.

Signal line connection diagram 500 shows three example configurations in which signal lines of signal processing device 504 may be coupled to an electronic device such as electronic device 216. In a first example configuration (labeled "1"), a first input connector (e.g., first input connector 102) of the electronic device may be coupled to input connector 522 at a location 530, thereby making input connector 522 a first signal line of signal processing device 504. A second input connector (e.g., second input connector 104) of the electronic device may be coupled to output connector 524 at a location 532, thereby making output connector 524 a second signal line of signal processing device 504. Accordingly, in the first example configuration, differences generated by portions of signal processing device 504 between location 530 and location 532—which might be generated by any of the integrated circuits and/or interconnects on the end-to-end path between input connector 522 and output connector 524—may be detected.

In a second example configuration (labeled "2"), the first input connector of the electronic device may be coupled to first interconnect 592 at a location 534, thereby making first interconnect 592 (at location 534) a first signal line of signal processing device 504. The second input connector of the electronic device may be coupled to third interconnect 596 at a location 536, thereby making third interconnect 596 (at location 536) a second signal line of signal processing device 504. Accordingly, in the second example configuration, differences generated by portions of signal processing device 504 between location 534 and location 536—which might be generated by integrated circuit 560, integrated circuit 570, first interconnect 592, second interconnect 594, and/or third interconnect 596—may be detected. In contrast, differences generated by portions of signal processing device 504 that are not between location 534 and location 536 may not be detected. For example, an artifact generated by a flaw either in integrated circuit 560 or in integrated circuit 570 may be detected, but an artifact generated by a flaw in integrated circuit 580 may not be detected.

In a third example configuration (labeled "3"), the first input connector of the electronic device may be coupled to a first interconnect 592 at a location 538 (which might, or might not, be electrically distinguishable from location 592), thereby making first interconnect 592 (at location 538) a first signal line of signal processing device 504. The second input connector of the electronic device may be coupled to second interconnect 594 at a location 540, thereby making second interconnect 594 (at location 540) a second signal line. Accordingly, in the third example configuration, differences generated by portions of signal processing device 504 between location 538 and location 540—which might be generated by integrated circuit 560, first interconnect 592, and/or second interconnect 594—may be detected. In contrast, differences generated by portions of signal processing device 504 that are not between location 538 and location 540 may not be detected. For example, an artifact generated by a flaw in integrated circuit 560 may be detected, but an artifact generated by a flaw in integrated circuit 570 or integrated circuit 580 may not be detected.

Thus, by coupling inputs and outputs of the electronic device to various locations on the signal processing circuitry of the signal processing device 504, components (e.g., such as integrated circuits) may be selectively isolated to determine whether an artifact generated in the second signal may be generated at an isolated component. For example, with the electronic device positioned at position 511, to determine whether an artifact detected in the second signal may be due to a flaw in integrated circuit 560, integrated circuit 570, and/or integrated circuit 580, an engineer may couple the electric device as indicated with the electronic device positioned at position 515. If the artifact is still detected in the second signal, it may be deduced that there may be a flaw in integrated circuit 560 and/or integrated circuit 570. The engineer may then couple the electric device as indicated with the electronic device positioned at position 519. If the artifact is still detected in the second signal, it may be deduced that there may be a flaw in integrated circuit 560. In this way, a defective component of the signal processing circuitry may be identified.

Returning to FIG. 2A, electronic device 216 may be operated concurrently with and in parallel with amplification device 204. So, for configurations in which first input connector 218 of electronic device 216 is coupled to first connection 208, an input audio signal may be received both at input connector 222 of audio amplification device 204 and at first input connector 218 of electronic device 216. Similarly, for configurations in which second input connector 220 of electronic device 216 is coupled to second connection 210, an output audio signal may be received both at speaker 206 and at second input connector 220 of electronic device 216.

FIG. 2B shows a schematic diagram of a second signal processing system 250 including electronic device 216. In second signal processing system 250, electronic device 216 may be electronically coupled with a second electronic device 252. Specifically, an output 254 of electronic device 216 may be electronically coupled with an input 256 of second electronic device 252. In the embodiment depicted in FIG. 2B, output 254 may be a USB connector (e.g., USB connector 110 of FIG. 1A). In other embodiments, output 254 may be a different type of connector, and/or may be arranged on electronic device 216 at a different location. In the embodiment depicted in FIG. 2B, second electronic device 252 may be an oscilloscope or another signal-analysis device. In other embodiments, second electronic device 252 may be a computer coupled to a monitor, where one or more software applications running on the computer may be used to display, analyze, or process electronic signals. In still other embodiments, second electronic device 252 may be a different type of electronic device.

As described in greater detail below in reference to FIGS. 3A and 3B, electronic device 216 may store one or more recordings of an observed behavior of first signal 212, an observed behavior of second signal 214, and/or an expected behavior of second signal 214 based on the observed behavior of first signal 212 from an operation of electronic device 216 within first signal processing system 200. During a subsequent operation of electronic device 216 within second signal processing system 250, one or more of the recordings may be transmitted from electronic device 216 to second electronic device 252 for processing, display, and/or storage.

For example, second electronic device 252 may include an oscilloscope, and one or more recordings may be transmitted from electronic device 216 to the oscilloscope, which may then display the recordings. Second electronic device 252 may be configured to display a first signal 258 (which may be a recording of an observed behavior of first signal 212, or a recording of an expected behavior of second signal 214) as well as a second signal 260 (which may be a recording of an observed behavior of second signal 214). First signal 258 may be displayed alongside second signal 260 and/or together within a shared display area. First signal 258 may be displayed concurrently with second signal 260.

In the configuration described above, second electronic device 252 may be used to compare first signal 258 with second signal 260 to identify intervals that may include possible artifacts. For example, first signal 258 may be a recording of the expected behavior of second signal 214, and second signal 260 may be a recording of the observed behavior of second signal 214. A user may then compare first signal 258 with second signal 260 and identify one or more intervals during which portions of first signal 258 differ from portions of second signal 260 beyond a threshold tolerance. Additionally, one or more software applications may be used to aid the user in detecting differences between first signal 258 and second signal 260.

In some embodiments, first signal 258 may be a recording of the observed behavior of first signal 212, and the expected behavior of second signal 214 may be established by electronic device 252. For example, in embodiments where the expected behavior includes amplification of first signal 212, the expected behavior of second signal 214 may at least in part be established by multiplying the observed behavior of the first signal by an amplifier gain at electronic device 252. As a result, in some embodiments, electronic device 100 may generate the expected behavior of second signal 214 based on the observed behavior of first signal 212, then record and transmit the expected behavior of second signal 214 to electronic device 252. Alternatively (or additionally), for some embodiments, electronic device 100 may record an observed behavior of first signal 212, then transmit the observed behavior of first signal 212 to electronic device 252, which may thereafter generate an expected behavior of second signal 214 based on the observed behavior of first signal 212.

Referring now to FIG. 3A, a flowchart of an exemplary method 300 is shown for selectively recording differences detected between two electronic signals. Method 300 may be implemented by an electronic device (such as electronic device 100 or electronic device 216) during operation of the electronic device within a signal processing system. In some embodiments, the signal processing system may be included in a controlled and/or testing environment, for example, at an engineering work bench of a manufacturer of a device such as an audio device. In other embodiments, the signal processing system may be included in a remote environment, for example, in a vehicle (such as first signal processing system 200). In various embodiments, the electronic device may include one or more processors (such as processors 152) and a non-transitory memory (such as memory 154) having instructions that, when executed by the one or more processors, cause the one or more processors to carry out part of, or all of, method 300. Method 300 may comprise a number of procedural parts, which in some embodiments may be executed in an order described below.

Method 300 begins at a part 302, where method 300 includes ensuring that a first signal line into the electronic device and a second signal line into the electronic device are connected. As described above in relation to FIG. 2A, the first signal line may carry a first signal that is generated by a source (e.g., audio source 202) and transmitted to a signal processing device (e.g., amplification device 204). Likewise, the second signal line may carry a second signal that is generated by the signal processing device (for example, to be transmitted to a speaker of an audio system).

In some embodiments, the electronic device may be manually switched on by a user, and after being manually switched on, the electronic device may ensure that the first signal line and the second signal line are connected. In other embodiments, the electronic device may be automatically switched on when a connection of the first signal line and a connection of the second signal line are detected. In still other embodiments, the electronic device may be automatically switched on when a first signal is detected on the first signal line and/or when a second signal is detected on the second signal line. As described above, in some embodiments, the user may select a scan switch of the electronic device to scan for signals on the first signal line or second signal line, and if the first signal and/or the second signal are detected, an indication may be provided to the user via one or more indicator lights of the electronic device.

In some embodiments, either or both of the first signal line and the second signal line may originate at a point outside a housing or external case of the signal processing device, such as at or upstream of an input connector of the signal processing device (e.g., input connector 222), or at or downstream of an output connector of the signal processing device (e.g., output connector 224). In other embodiments, either or both of the first signal line and the second signal line may originate at a point inside the housing or external case. In other words, either or both of the first signal line and the second signal line may originate at a point within an internal signal processing circuitry of the signal processing device, as described above in reference to FIG. 5.

For example, a user of the electronic device may establish the first signal line by coupling the electronic device, via a first cable, to the input connector of the signal processing device, and the user may establish the second signal line by coupling the electronic device, via a second cable, to a pin or trace on a component or circuit of the internal circuitry upstream of the output connector of the signal processing device. Alternatively, the user may establish the first signal line by coupling the electronic device, via the first cable, to a pin or trace on a component or circuit of the signal processing circuitry downstream of the input connector of the signal processing device, and the user may establish the second signal line by coupling the electronic device, via the second cable, to the output connector of the signal processing device.

Thus, an end-to-end path of a signal including a signal processing circuitry may be broken into a series of portions, and each portion may be analyzed by the electronic device separately. For example, in a first debugging stage, the user may analyze a first portion of the end-to-end path including an entirety of the signal processing circuitry, by coupling the electronic device to the input connector of the signal processing device and to the output connector of the signal processing device. In a second debugging stage, the user may analyze a second portion of the end-to-end path including a first circuitry section of the signal processing circuitry, by coupling the electronic device to the input connector of the signal processing device and to a pin or trace at an end of the first circuitry section. In a third debugging stage, the user may analyze a third portion of the end-to-end path including a second circuitry section of the signal processing circuitry, by coupling the electronic device to the pin or trace at the end of the first circuitry section and to a pin or trace at an end of the second circuitry section. In a fourth debugging stage, the user may analyze a fourth portion of the end-to-end path, the fourth portion entirely included within the third portion. In this way, the user may iteratively adjust a coupling of the first signal line and the second signal line to the electronic device to isolate a specific portion of the signal processing circuitry that may be exhibiting anomalous behavior, for example, to discover a precise location of a flaw of the signal processing circuitry.

In various embodiments, the first signal line may be coupled to the electronic device at a first input connector of the electronic device, such as first input connector 102. Similarly, the second signal line may be coupled to the electronic device at a second input connector of the electronic device, such as second input connector 104. In other embodiments, one or both of the first signal line and the second signal line might not be coupled to the electronic device, and the one or both of the first signal line and the second signal line may be connected to the electronic device via a wireless connection.

In some embodiments, the electronic device may connect to a first signal line and/or a second signal line via one or more Bluetooth® connections. (Bluetooth® is a registered trademark of the Bluetooth Special Interest Group, Incorporated, headquartered in Kirkland, Washington) For example, the electronic device may be a handheld device used in a vehicle and operated within a vehicle sound system, and the electronic device may be connected via one or more Bluetooth® connections to one or more inputs and/or outputs of an audio source of the vehicle sound system, an amplification device of the vehicle sound system, and a speaker of the vehicle sound system.

Alternatively, the first signal line and the second signal line may be established at the electronic device via one or more external microphones coupled to the electronic device. For example, the first signal line may be established via a first microphone coupled to a first input of the electronic device, and the second signal line may be established via a second microphone coupled to a second input of the electronic device. Either or both of the first microphone and the second microphone may be connected to the electronic device via Bluetooth® connections.

In other embodiments, the electronic device may connect to a first signal line and/or a second signal line via a different type of wireless network, such as a non-Bluetooth® personal area network, a local area network (LAN), a metropolitan area network (MAN), or a wide area network (WAN). For example, the electronic device may be operated within a home stereo system, and the electronic device may be connected to one or more of an audio source, an amplification device, and a speaker via one or more Wi-Fi connections. It should be appreciated that the examples provided herein are for illustrative purposes, and different or additional types of couplings and/or wireless connections may be used without departing from the scope of this disclosure.

Further, in some embodiments, a plurality of first signal lines and a corresponding plurality of second signal lines may be connected to the electronic device. The plurality of first signal lines and the corresponding plurality of second signal lines may be established with respect to a corresponding plurality of signal sources and/or signal processing systems, or with respect to a corresponding plurality of first signals and second signals transmitted by a single source.

In other embodiments, the electronic device may be operated in a standalone mode, where one or more first signal lines may be internal to the electronic device. For example, a first signal carried on a first signal line may be generated by the electronic device (e.g., if a different source is not available).

At a part 304, method 300 includes receiving the first signal via the first signal line. The first signal may be substantially similar to the first signal 212 described above in reference to FIG. 2A.

At a part 306, method 300 includes receiving the second signal via the second signal line. The second signal may be substantially similar to the second signal 214 described above in reference to FIG. 2A. The second signal may be generated as an output of the signal processing device.

At a part 308, method 300 includes determining an expected behavior of the second signal, where the second signal is derived from the first signal received via the first signal line. In embodiments where the first signal line is established respect to a signal of the signal processing device, the expected behavior of the second signal may be based on one or more operations performed on the first signal by the signal processing device to generate the second signal. For example, if the signal processing device multiplies the first signal by an amplification gain to generate the second signal, determining the expected behavior of the second signal may include multiplying the first signal by the amplification gain at the electronic device. In this way, the electronic device may mimic an expected processing of the first signal by the signal processing device to generate an output that is substantially similar to an output generated by the signal processing device.

At part 310, determining the expected behavior of the second signal may include performing an analog-to-digital or digital-to-analog conversion of the first signal. The first signal received via the first signal line may be an analog signal or a digital signal. For example, the digital signal may be an audio signal received via an Automotive Audio Bus (A2B) connection, or an Ethernet Audio Video Bridging (AVB) connection, or a Sony/Philips Digital Interface (S/PDIF) connection. Similarly, the second signal received via the second signal line may be an analog signal or a digital signal.

In some embodiments, an analog first signal may be converted to a digital first signal to match a signal type of the second signal. For example, in response to detecting that the first signal is an analog signal and that the second signal is a digital signal, the electronic device may convert the analog first signal to a digital first signal. In other embodiments, in response to detecting that the first signal is a digital signal and that the second signal is an analog signal, the electronic device may convert the digital first signal to an analog first signal. Alternatively, in response to detecting that the first signal is an analog signal and that the second signal is also an analog signal, the electronic device might not convert the analog first signal to a digital first signal, and in response to detecting that the first signal is a digital signal and that the second signal is also a digital signal, the electronic device might not convert the digital first signal to an analog first signal.

At a part 311, method 300 includes compensating for a latency of the second signal. In embodiments where the first signal line is established with respect to a signal of the signal processing device, the second signal may be delayed with respect to the first signal. The delay may be based on a time taken by the signal processing device to perform the one or more operations on the first signal to generate the second signal. To compensate for the latency of the second signal with respect to the first signal, a latency compensation time may be added as an offset to the expected behavior of the second signal, such that the expected behavior of the second signal is temporally aligned with an observed behavior of the second signal. In some embodiments, the offset may be configured using a separate computing device coupled to the electronic device via a USB connector (e.g., the USB connector 110).

For example, the one or more operations may include multiplying the first signal by an amplification gain, and a time taken to perform the multiplication may introduce a delay in generating the second signal. In some embodiments, other operations may be additionally performed by the signal processing device which may introduce further delays. To compensate for the delays, a corresponding delay time may be added as an offset to the expected behavior of the second signal, such that a portion of the expected behavior of the second signal and a corresponding portion of the observed behavior of the second signal occur at substantially the same time. In various embodiments, the electronic device may have a configurable offset time, or phase shift, by which to shift the expected behavior of the second signal with respect to the observed behavior of the second signal for purposes of subsequent comparison.

At a part 312, method 300 includes recording the expected behavior of the second signal and the observed behavior of the second signal in a memory of the electronic device (e.g., the memory 154). In various embodiments, the recording of the expected behavior of the second signal and the observed behavior of the second signal may automatically begin when the expected behavior of the second signal has been determined and the observed behavior has been received. In other embodiments, the recording of the expected behavior of the second signal and the observed behavior of the second signal may not automatically begin, and may be initiated by a user of the electronic device. For example, the user may initiate the recording by adjusting a switch of the electronic device (e.g., one of the functionality switches 120). In various embodiments, an observed behavior of the first signal may be recorded instead of, or in addition to, an expected behavior of the second signal.

At a part 314, method 300 includes determining whether a difference exists between the expected behavior of the second signal and an observed behavior of the second signal. Determining whether a difference exists between the expected behavior of the second signal and an observed behavior of the second signal may include comparing a portion of the expected behavior of the second signal with a portion of the observed behavior of the second signal, where the portions both occur over a span of time T. When comparing the first portion with the second portion over the time T, a difference between the first portion and the second portion may be calculated, then compared to a threshold difference. In various embodiments, the calculation of the difference may include integrals of continuous functions, integrals of discrete functions, and/or integrals of differences between functions, depending on whether the first portion and the second portion are digital or analog signals.

If at part 314 it is determined that no differences exist between the expected behavior of the second signal and the observed behavior of the second signal, method 300 proceeds back to part 304, continuing to receive the first signal and the second signal in a signal comparison loop. If at part 314 it is determined that a difference exists between the expected behavior of the second signal and the observed behavior of the second signal, method 300 proceeds to a part 316.

At part 316, method 300 includes storing the recording of the first signal and/or the expected behavior of the second signal, and the recording of the observed behavior of the second signal in a memory of the electronic device (e.g., the memory 154 of electronic device 100), where the second recording includes the difference. Storing the recording of the expected behavior of the second signal and the recording of the observed behavior of the second signal may include determining a suitable duration of the recordings to store. In various embodiments, a time interval of the recording duration may include a first span of time during which no differences are detected between the expected behavior of the second signal and the observed behavior of the second signal; a second span of time during which a difference is detected between the expected behavior of the second signal and the observed behavior of the second signal; and/or a third span of time during which no differences are detected between the expected behavior of the second signal and the observed behavior of the second signal. In various embodiments, a recording of the observed behavior of the first signal may be stored instead of, or in addition to, the recording of the expected behavior of the second signal.

In some embodiments, the second span of time may encompass and/or be defined by a length of time during which a difference between the expected behavior of the second signal and the observed behavior of the second signal persists, and the first span of time and the third span of time may be pre-defined. For example, a detected difference may trigger (or otherwise establish) a starting point or an end point of the second span of time, and the time interval of the stored recording may be established by the pre-defined first span of time and/or a predefined third span of time with respect to the second span of time. The first pre-defined duration may be equivalent to the third pre-defined duration, or the first pre-defined duration might not be equivalent to the third pre-defined duration.

At a part 318, method 300 includes determining whether conditions have been met for exiting the signal comparison loop. The conditions for exiting the signal comparison loop may include a conclusion of playback of a signal of a signal processing system, or a powering off a signal processing device coupled to a source and/or the one or more output devices (e.g., audio source 202, amplification device 204, and speaker 206 of signal processing system 200). The conditions for exiting the signal comparison loop may also include a powering off of the electronic device and/or exceeding an amount of available storage space in the memory of the electronic device. If at part 318 conditions are not met for exiting the signal comparison loop, method 300 proceeds back to part 304 to continue with the signal comparison loop. If at part 318 the conditions are met for exiting the signal comparison loop, method 300 ends.

Referring now to FIG. 3B, a flowchart of an exemplary method 350 is shown for transferring recorded artifacts detected in an electronic signal to a second electronic device. Method 350 may be implemented by an electronic device such as electronic device 100 or electronic device 216, during operation of the electronic device within a system such as second signal processing system 250. In various embodiments, an electronic device may include one or more processors (such as processors 152) and a non-transitory memory (such as memory 154) having instructions that, when executed by the one or more processors, cause the one or more processors to carry out part of, or all of, method 350.

Method 350 begins at a part 352, where method 350 includes determining whether one or more recordings are detected in a memory of the electronic device. The recordings may include a first recording of an expected behavior of a signal and a second recording of an observed behavior of a signal (e.g., the second signal described above with respect to FIG. 3A). As described above in reference to FIG. 1A, a user of the electronic device may select a scan switch (e.g., one of the functionality switches 120) to initiate a scan of the memory of the electronic device for recordings.

If at part 352 it is determined that one or more recordings are not detected in the memory of the electronic device, method 350 proceeds to a part 354. At part 354, method 350 includes providing an indication that no recordings were detected. For example, a first indicator light (e.g., first indicator light 112 of electronic device 100) may not be illuminated, indicating that no recordings were detected in the memory, or the first indicator light may be illuminated in a first predetermined color to indicate that no recordings were detected in the memory.

If at part 352 it is determined that one or more recordings are detected in the memory of the electronic device, method 350 proceeds to a part 356. At part 356, method 350 includes indicating that the one or more recordings were detected in a memory of the electronic device. For example, the first indicator light may be illuminated to indicate that the one or more recordings were detected in the memory, or the first indicator light may be illuminated in a second predetermined color to indicate that the one or more recordings were detected in the memory.

At a part 358, method 350 includes ensuring that an output of the electronic device is connected to an input of a second electronic device, such as output 254 of electronic device 216 and input 256 of second electronic device 252, respectively. In various embodiments, the second electronic device may be an oscilloscope, which may be used to display the one or more recordings on a display screen.

At a part 360, method 350 includes outputting one or more recordings of the one or more recordings to the second electronic device, and method 350 ends. By displaying the one or more recordings on the display screen of the oscilloscope, a user may be able to compare the expected behavior of the first recording with the observed behavior of the second recording.

For example, the expected behavior of the first recording may be displayed on the display screen concurrently with the observed behavior of the second recording, and the expected behavior and the observed behavior may be plotted with respect to a common horizontal time axis. The user may visually compare a first aspect of the observed behavior occurring at a time T with a corresponding second aspect of the expected behavior also occurring at the time T. If the first aspect does not match the corresponding second aspect at the time T, the user may conclude that an artifact has been detected at the time T. The user may further analyze differences between the first aspect and the second aspect to determine a root cause of the artifact.

Referring now to FIG. 4, an operational sequence diagram 400 is shown illustrating a timing of a sequence of events that occur and/or operations that are carried out during processing of a signal by an electronic device as discussed herein (such as electronic device 100, or electronic device 216). The horizontal axis (x-axis) denotes time, and the vertical lines t1-t5 identify various moments in operational sequence diagram 400.

Operational sequence diagram 400 includes six plots. In the first plot, a line 402 depicts an observed first signal received from a source (e.g., first signal 212).

In the second plot, a line 404 depicts an expected second signal, which may be generated based on the observed first signal (e.g., by an electronic device 100 and/or an electronic device 216, as disclosed herein), in accordance with an expected processing of the first signal by an external circuitry outside the electronic device. In various embodiments, the external circuitry may be amplification circuitry (e.g., of an amplifier), and the expected second signal may be an expected amplification of the first signal.

In the third plot, a line 406 depicts an observed second signal (e.g., second signal 214), which may be an actual output of the external circuitry corresponding with the expected second signal. The observed second signal may be generated in accordance with the processing of the first signal by the external circuitry. For example, in embodiments where the external circuitry is an amplification circuitry, the observed second signal may be an amplification of the first signal. The observed second signal may be substantially similar to the expected second signal, over a majority and/or a near entirety of the observed second signal and the expected second signal.

In other words, the observed first signal may be provided as in input to both the electronic device and an amplification device (or a part of an amplification device), the observed second signal may be an amplification of the first signal performed by the amplification device, and the expected second signal may be an amplification of the observed first signal, as determined or calculated by the electronic device.

In the fourth plot, a line 408 indicates a recording of the observed first signal and the expected second signal performed by the electronic device in real time. For example, the electronic device may record the expected second signal to a memory of the electronic device, and may concurrently record the observed first signal to the memory of the electronic device.

In the fifth plot, a line 410 indicates where a difference is detected between the expected second signal and the observed second signal. For example, an artifact may be present in the observed second signal that is not present in the expected second signal. Such artifacts may result from flaws in the amplification device.

In the sixth plot, a line 412 indicates when a recording of the expected second signal and/or the observed second signal may be stored in a memory of the electronic device. Stored recordings may be subsequently transmitted to a second electronic device for display, processing, storage, or another reason, as described above in reference to FIG. 3B.

At time t0, the electronic device may be switched on and may begin receiving the first signal (e.g., from the source). As described above in relation to FIG. 2A, the observed first signal may be received from a first signal line at a first input connector (e.g., the first input connector 218).

At time t1, the electronic device generates the expected second signal shown by line 404. As described above, in some embodiments, the electronic device may generate the expected second signal by amplifying the observed first signal. At time t1, the electronic device may also receive the observed second signal shown by line 406. As described above in relation to FIG. 2A, the observed second signal may be received from a second signal line at a second input connector (e.g., the second input connector 220). In various embodiments, the observed second signal may be a signal obtained as output from an amplification circuitry coupled to the source and provided as input to a device such as a speaker for playback. In FIG. 4, a time taken by the electronic device to generate the expected second signal is shown as equivalent to a time taken by the amplification circuitry to generate the observed second signal (e.g., a time interval between time t0 and time t1). In other embodiments, the time taken by the electronic device to generate the expected second signal might not be equivalent to the time taken by the application circuitry to generate the observed second signal, and the observed second signal may be received prior to or after the expected second signal is generated by the electronic device.

When the expected second signal is generated and the observed second signal is being received, the electronic device may record the expected second signal and the observed second signal in a memory of the electronic device, as indicated by line 406.

Between time t1 and t2, no differences are detected between the expected second signal and the observed second signal, and line 402 and line 404 may appear substantially similar prior to reaching t2.

At time t2, a difference may be detected between the expected second signal and the observed second signal, as shown by line 410, where the difference is indicated by a discontinuity 407 of line 404. The difference may be a result of an artifact manifesting in the observed second signal, such that, for example, a listener of the observed second signal at a speaker may observe an unexpected sound in the observed second signal. In various examples, the sound may be a pop, a click, or other out-of-place sound (e.g., resulting from an amplification flaw).

Between time t2 and time t3, the difference between the expected second signal and the observed second signal continues. At time t3, the difference between the expected second signal and the observed second signal disappears, as shown by line 410, such that after time t3, no differences are detected between the expected second signal and the observed second signal.

At time t4, as a result of the difference being detected between the expected second signal and the observed second signal at discontinuity 407, a recording of a portion of the expected second signal and the corresponding portion of the observed second signal may be stored, as shown by line 412. The portion of the expected second signal and the corresponding portion of the observed second signal that are stored in the recording may extend over a time interval 414. The time interval 414 may be initiated at a time 416 prior to the detection of the difference between expected second signal and the observed second signal, and may conclude at a time 418 after the difference between expected second signal and the observed second signal is no longer detected. In some embodiments, the time interval 414 may begin at a threshold duration 420 prior to detection of the difference, and may conclude at the threshold duration 420 after the difference is no longer detected. Thus, a midpoint of a duration of the difference may coincide with a midpoint of the time interval 414, with time intervals during which no differences are detected between the expected signal and the observed signal being included at a beginning and an end of the time interval 414.

At time t5, the recording of the portion of the expected second signal and the corresponding portion of the observed second signal concludes, and the electronic device continues to monitor for differences between the expected second signal and the observed second signal.

Thus, the methods and systems disclosed herein may allow a user such as a sound engineer to detect and resolve artifacts detected in an output of amplification circuitry, without having to manually monitor an amplifier output in a time-consuming debugging process. Rather than monitoring a performance of the amplification circuitry in real time to reproduce the artifacts, an electronic device may automatically collect sample signals including the artifacts, without relying on the presence of the sound engineer. By separating a lengthy debugging process into a first, automatic sample collection phase that may take a longer period of time, and a second, sample analysis phase that may take a shorter period of time, a greater number of artifacts may be collected and the artifacts may be resolved faster and more efficiently. Once artifact issues have been resolved, the electronic device may be used for durability testing of the amplification circuitry, where a performance of the amplification circuitry may be monitored and assessed over longer periods of time without engineer intervention. As a result, engineering resources of a manufacturer of the amplification circuitry may be better managed at lower cost, while performance standards of the amplification circuitry may be improved. Accordingly, a technical effect of using an electronic device to monitor one or more amplified signals for artifacts and automatically collect samples including artifacts may be that an amount of time used to debug and resolve the artifacts may be reduced.

The disclosure provides support for a method, comprising: connecting a first input of an electronic device to a first signal line of an amplification device; connecting a second input of the electronic device to a second signal line of the amplification device, the second signal line being downstream from the first signal line, establishing, based on an observed behavior of a first signal on the first signal line, an expected behavior of a second signal on the second signal line, and determining whether a difference exists between the expected behavior of the second signal and an observed behavior of the second signal. In a first example of the system comprising: storing, in a memory of the electronic device, a recording of the observed behavior of the second signal and at least one of a recording of the observed behavior of the first signal and a recording of the expected behavior of the second signal, in response to determining that a difference exists between the expected behavior of the second signal and the observed behavior of the second signal. In a second example of the system, optionally including the first example, the electronic device is a first electronic device, comprising: connecting an output of the first electronic device to an input of a second electronic device, and displaying, on a display of the second electronic device, one or more of the recording of the observed behavior of the first signal, the recording of the observed behavior of the second signal, and the recording of the expected behavior of the second signal. In a third example of the system, optionally including one or both of the first and second examples, the first signal line is upstream of an amplification circuitry and the second signal line is downstream of the amplification circuitry. In a fourth example of the system, optionally including one or more or each of the first through third examples, both the first signal and the second signal are analog-domain signals, and establishing the expected behavior of the second signal comprises: multiplying the observed behavior of the first signal by an amplifier gain between the first signal line and the second signal line. In a fifth example of the system, optionally including one or more or each of the first through fourth examples, the first signal has a domain selected from one of: an analog domain, and a digital domain, and wherein establishing the expected behavior of the second signal comprises: converting the first signal into an alternate-domain version of the first signal having a different domain than the domain of the first signal, and establishing, based on the alternate-domain version of the first signal, the expected behavior of the second signal. In a sixth example of the system, optionally including one or more or each of the first through fifth examples, the display device includes at least one of an oscilloscope, a computer coupled to a display screen, and a portable computing device. In a seventh example of the system, optionally including one or more or each of the first through sixth examples, the electronic device includes a portable power supply. In an eighth example of the system, optionally including one or more or each of the first through seventh examples, the electronic device is a handheld device. In a ninth example of the system, optionally including one or more or each of the first through eighth examples, the amplification device is installed in a vehicle. In a tenth example of the system, optionally including one or more or each of the first through ninth examples, in a first condition, at least one difference is determined to exist between the expected behavior of the second signal and the observed behavior of the second signal, and a recording of the observed behavior of the second signal and at least one of a recording of the observed behavior of the first signal and a recording of the expected behavior of the second signal are stored in a memory of the electronic device, and in a second condition, no differences are determined to exist between the expected behavior of the second signal and the observed behavior of the second signal, and no recordings of the observed behavior of the first signal, the expected behavior of the second signal, and the observed behavior of the second signal are stored in a memory of the electronic device. In an eleventh example of the system, optionally including one or more or each of the first through tenth examples, the electronic device includes a plurality of first inputs and a plurality of second inputs.

The disclosure also provides support for a system, comprising: an electronic device including a first input operable to connect to a first signal line of an amplification device, a second input operable to connect to a second signal line of the amplification device, one or more processors, and a non-transitory memory including instructions that when executed cause the one or more processors of the electronic device to: record a first signal received at the first input during operation of the amplification device, record a second signal received at the second input during operation of the amplification device, detect whether a difference exists between an expected behavior of the second signal and an observed behavior of the second signal, and store, in response to a difference being detected, a recording of the observed behavior of the second signal and at least one of a recording of an observed behavior of the first signal and a recording of the expected behavior of the second signal in the non-transitory memory. In a first example of the system, the instructions, when executed, further cause the processor to: transmit at least one of the recording of the observed behavior of the second signal, the recording of the observed behavior of the first signal, and the recording of the expected behavior of the second signal to an output of the electronic device. In a second example of the system, optionally including the first example, the electronic device is a first electronic device, further comprising: a second electronic device including an input coupled to the output of the first electronic device, a display, one or more processors, and a non-transitory memory including instructions that when executed cause the one or more processors of the second electronic device to: output, to the display, an image of the recording of the second signal, and output, to the display, at least one of: an image of the recording of the first signal, and an image of an expected behavior of the second signal based on the recording of the first signal. In a third example of the system, optionally including one or both of the first and second examples, the first input is coupled to at least one of the amplification device and an output of a source of a signal. In a fourth example of the system, optionally including one or more or each of the first through third examples, the output of the source carries an analog-domain signal. In a fifth example of the system, optionally including one or more or each of the first through fourth examples, the output of the source carries a digital-domain signal.

The disclosure also provides support for a method for detecting transient artifacts of an amplifier, comprising: connecting a first input of an electronic device to a first signal line of an amplification device, connecting a second input of the electronic device to a second signal line of the amplification device, the second signal line being downstream from the first signal line, establishing, based upon at least an observed behavior of a first signal on the first signal line and an expected amplifier gain between the first signal line and the second signal line, an expected behavior of a second signal on the second signal line, detecting an artifact based upon a difference between the expected behavior of the second signal and an observed behavior of the second signal, and storing, in the electronic device, a recording of the observed behavior of the second signal and at least one of a recording of the observed behavior of the first signal and a recording of the expected behavior of the second signal, based upon the detection of the artifact. In a first example of the method, wherein the electronic device is a first electronic device, the method further comprises connecting an output of the first electronic device to an input of a second electronic device, and displaying, on a display of the second electronic device, the recording of the first signal and at least one of the recording of the observed behavior of the first signal and the recording of the expected behavior of the second signal.

The disclosure also provides support for a method, comprising: connecting a first input of an electronic device to a first signal line of a signal processing device; connecting a second input of the electronic device to a second signal line of the signal processing device, the second signal line being downstream from the first signal line, establishing, based on an observed behavior of a first signal on the first signal line, an expected behavior of a second signal on the second signal line, and determining whether a difference exists between the expected behavior of the second signal and an observed behavior of the second signal. In a first example of the system comprising: storing, in a memory of the electronic device, a recording of the observed behavior of the second signal and at least one of a recording of the observed behavior of the first signal and a recording of the expected behavior of the second signal, in response to determining that a difference exists between the expected behavior of the second signal and the observed behavior of the second signal. In a second example of the system, optionally including the first example, the electronic device is a first electronic device, comprising: connecting an output of the first electronic device to an input of a second electronic device, and displaying, on a display of the second electronic device, one or more of the recording of the observed behavior of the first signal, the recording of the observed behavior of the second signal, and the recording of the expected behavior of the second signal. In a third example of the system, optionally including one or both of the first and second examples, the first signal line is upstream of a signal processing circuitry and the second signal line is downstream of the signal processing circuitry. In a fourth example of the system, optionally including one or more or each of the first through third examples, both the first signal and the second signal are analog-domain signals, and establishing the expected behavior of the second signal comprises: multiplying the observed behavior of the first signal by an amplifier gain between the first signal line and the second signal line. In a fifth example of the system, optionally including one or more or each of the first through fourth examples, the first signal has a domain selected from one of: an analog domain, and a digital domain, and wherein establishing the expected behavior of the second signal comprises: converting the first signal into an alternate-domain version of the first signal having a different domain than the domain of the first signal, and establishing, based on the alternate-domain version of the first signal, the expected behavior of the second signal. In a sixth example of the system, optionally including one or more or each of the first through fifth examples, the display device includes at least one of an oscilloscope, a computer coupled to a display screen, and a portable computing device. In a seventh example of the system, optionally including one or more or each of the first through sixth examples, the electronic device includes a portable power supply. In an eighth example of the system, optionally including one or more or each of the first through seventh examples, the electronic device is a handheld device. In a ninth example of the system, optionally including one or more or each of the first through eighth examples, the signal processing device is installed in a vehicle. In a tenth example of the system, optionally including one or more or each of the first through ninth examples, in a first condition, at least one difference is determined to exist between the expected behavior of the second signal and the observed behavior of the second signal, and a recording of the observed behavior of the second signal and at least one of a recording of the observed behavior of the first signal and a recording of the expected behavior of the second signal are stored in a memory of the electronic device, and in a second condition, no differences are determined to exist between the expected behavior of the second signal and the observed behavior of the second signal, and no recordings of the observed behavior of the first signal, the expected behavior of the second signal, and the observed behavior of the second signal are stored in a memory of the electronic device. In an eleventh example of the system, optionally including one or more or each of the first through tenth examples, the electronic device includes a plurality of first inputs and a plurality of second inputs.

The disclosure also provides support for a system, comprising: an electronic device including a first input operable to connect to a first signal line of an signal processing device, a second input operable to connect to a second signal line of the signal processing device, one or more processors, and a non-transitory memory including instructions that when executed cause the one or more processors of the electronic device to: record a first signal received at the first input during operation of the signal processing device, record a second signal received at the second input during operation of the signal processing device, detect whether a difference exists between an expected behavior of the second signal and an observed behavior of the second signal, and store, in response to a difference being detected, a recording of the observed behavior of the second signal and at least one of a recording of an observed behavior of the first signal and a recording of the expected behavior of the second signal in the non-transitory memory. In a first example of the system, the instructions, when executed, further cause the processor to: transmit at least one of the recording of the observed behavior of the second signal, the recording of the observed behavior of the first signal, and the recording of the expected behavior of the second signal to an output of the electronic device. In a second example of the system, optionally including the first example, the electronic device is a first electronic device, further comprising: a second electronic device including an input coupled to the output of the first electronic device, a display, one or more processors, and a non-transitory memory including instructions that when executed cause the one or more processors of the second electronic device to: output, to the display, an image of the recording of the second signal, and output, to the display, at least one of: an image of the recording of the first signal, and an image of an expected behavior of the second signal based on the recording of the first signal. In a third example of the system, optionally including one or both of the first and second examples, the first input is coupled to at least one of the signal processing device and an output of a source of a signal. In a fourth example of the system, optionally including one or more or each of the first through third examples, the output of the source carries an analog-domain signal. In a fifth example of the system, optionally including one or more or each of the first through fourth examples, the output of the source carries a digital-domain signal.

The disclosure also provides support for a method for detecting transient artifacts of an amplifier, comprising: connecting a first input of an electronic device to a first signal line of an amplification device, connecting a second input of the electronic device to a second signal line of the amplification device, the second signal line being downstream from the first signal line, establishing, based upon at least an observed behavior of a first signal on the first signal line and an expected amplifier gain between the first signal line and the second signal line, an expected behavior of a second signal on the second signal line, detecting an artifact based upon a difference between the expected behavior of the second signal and an observed behavior of the second signal, and storing, in the electronic device, a recording of the observed behavior of the second signal and at least one of a recording of the observed behavior of the first signal and a recording of the expected behavior of the second signal, based upon the detection of the artifact. In a first example of the method, wherein the electronic device is a first electronic device, the method further comprises connecting an output of the first electronic device to an input of a second electronic device, and displaying, on a display of the second electronic device, the recording of the first signal and at least one of the recording of the observed behavior of the first signal and the recording of the expected behavior of the second signal.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices, such as the embodiments described above with respect to FIGS. 1-4. The methods may be performed by executing stored instructions with one or more logic devices (e.g., processors) in combination with one or more hardware elements, such as storage devices, memory, hardware network interfaces/antennas, switches, clock circuits, and so on. The described methods and associated actions may also be performed in various orders in addition to the order described in this application, in parallel, and/or simultaneously. The described systems are exemplary in nature, and may include additional elements and/or omit elements. The subject matter of the present disclosure includes all novel and non-obvious combinations and sub-combinations of the various systems and configurations, and other features, functions, and/or properties disclosed.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," "third," and so on are used merely as labels, and are not intended to impose numerical requirements or a particular positional order on their objects. The following claims particularly point out subject matter from the above disclosure that is regarded as novel and non-obvious.

Terminology in which elements are presented in a list using "and/or" language means any combination of the listed elements. For example, "A, B, and/or C" may mean any of the following: A alone; B alone; C alone; A and B; A and C; B and C; or A, B, and C.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method, comprising:
connecting a first input of an electronic device to a first signal line of an amplification device;
connecting a second input of the electronic device to a second signal line of the amplification device, the second signal line being downstream from the first signal line;
establishing, based on an observed behavior of a first signal on the first signal line, an expected behavior of a second signal on the second signal line; and
determining whether a difference exists between the expected behavior of the second signal and an observed behavior of the second signal.

2. The method of claim 1, comprising:
storing, in a memory of the electronic device, a recording of the observed behavior of the second signal and at least one of a recording of the observed behavior of the first signal and a recording of the expected behavior of the second signal, in response to determining that a difference exists between the expected behavior of the second signal and the observed behavior of the second signal.

3. The method of claim 2, wherein the electronic device is a first electronic device, comprising:
connecting an output of the first electronic device to an input of a second electronic device; and
displaying, on a display of the second electronic device, one or more of the recording of the observed behavior of the first signal, the recording of the observed behavior of the second signal, and the recording of the expected behavior of the second signal.

4. The method of claim 1, wherein the first signal line is upstream of an amplification circuitry and the second signal line is downstream of the amplification circuitry.

5. The method of claim 1, wherein both the first signal and the second signal are analog-domain signals, and establishing the expected behavior of the second signal comprises:
multiplying the observed behavior of the first signal by an amplifier gain between the first signal line and the second signal line.

6. The method of claim 1, wherein the first signal has a domain selected from one of: an analog domain, and a digital domain; and wherein establishing the expected behavior of the second signal comprises:
converting the first signal into an alternate-domain version of the first signal having a different domain than the domain of the first signal; and
establishing, based on the alternate-domain version of the first signal, the expected behavior of the second signal.

7. The method of claim 1, wherein the display device includes at least one of an oscilloscope, a computer coupled to a display screen, and a portable computing device.

8. The method of claim 1, wherein the electronic device includes a portable power supply.

9. The method of claim 1, wherein the electronic device is a handheld device.

10. The method of claim 1, wherein the amplification device is installed in a vehicle.

11. The method of claim 1, wherein:
in a first condition, at least one difference is determined to exist between the expected behavior of the second signal and the observed behavior of the second signal, and a recording of the observed behavior of the second signal and at least one of a recording of the observed behavior of the first signal and a recording of the expected behavior of the second signal are stored in a memory of the electronic device; and in a second condition, no differences are determined to exist between the expected behavior of the second signal and the observed behavior of the second signal, and no recordings of the observed behavior of the first signal, the expected behavior of the second signal, and the observed behavior of the second signal are stored in a memory of the electronic device.

12. The method of claim 1, wherein the electronic device includes a plurality of first inputs and a plurality of second inputs.

13. A system, comprising:
an electronic device including a first input operable to connect to a first signal line of a signal processing device, a second input operable to connect to a second signal line of the signal processing device, one or more processors, and a non-transitory memory including instructions that when executed cause the one or more processors of the electronic device to:
record a first signal received at the first input during operation of the signal processing device;
record a second signal received at the second input during operation of the signal processing device;
detect whether a difference exists between an expected behavior of the second signal and an observed behavior of the second signal; and
store, in response to a difference being detected, a recording of the observed behavior of the second signal and at least one of a recording of an observed behavior of the first signal and a recording of the expected behavior of the second signal in the non-transitory memory.

14. The system of claim 13, wherein the instructions, when executed, further cause the processor to:
transmit at least one of the recording of the observed behavior of the second signal, the recording of the observed behavior of the first signal, and the recording of the expected behavior of the second signal to an output of the electronic device.

15. The system of claim 14, wherein the electronic device is a first electronic device, further comprising:
a second electronic device including an input coupled to the output of the first electronic device, a display, one or more processors, and a non-transitory memory including instructions that when executed cause the one or more processors of the second electronic device to:
output, to the display, an image of the recording of the second signal; and
output, to the display, at least one of: an image of the recording of the first signal, and an image of an expected behavior of the second signal based on the recording of the first signal.

16. The system of claim 13, wherein the first input is coupled to at least one of the signal processing device and an output of a source of a signal.

17. The system of claim 16, wherein the output of the source carries an analog-domain signal.

18. The system of claim 16, wherein the output of the source carries a digital-domain signal.

19. A method for detecting transient artifacts of an amplifier, comprising:
connecting a first input of an electronic device to a first signal line of an amplification device;
connecting a second input of the electronic device to a second signal line of the amplification device, the second signal line being downstream from the first signal line;
establishing, based upon at least an observed behavior of a first signal on the first signal line and an expected amplifier gain between the first signal line and the second signal line, an expected behavior of a second signal on the second signal line;
detecting an artifact based upon a difference between the expected behavior of the second signal and an observed behavior of the second signal; and
storing, in the electronic device, a recording of the observed behavior of the second signal and at least one of a recording of the observed behavior of the first signal and a recording of the expected behavior of the second signal, based upon the detection of the artifact.

20. The method of claim 19, wherein the electronic device is a first electronic device, comprising:
connecting an output of the first electronic device to an input of a second electronic device; and
displaying, on a display of the second electronic device, the recording of the first signal and at least one of the recording of the observed behavior of the first signal and the recording of the expected behavior of the second signal.

* * * * *